(12) United States Patent
Kim et al.

(10) Patent No.: US 12,068,367 B2
(45) Date of Patent: Aug. 20, 2024

(54) SEMICONDUCTOR DEVICE

(71) Applicant: SAMSUNG ELECTRONICS CO., LTD., Suwon-si (KR)

(72) Inventors: Jun Hyeok Kim, Incheon (KR); Jae-Hyun Yoo, Suwon-si (KR); Ui Hui Kwon, Hwaseong-si (KR); Kyu Ok Lee, Suwon-si (KR); Yong Woo Jeon, Seoul (KR); Da Won Jeong, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 233 days.

(21) Appl. No.: 17/581,026

(22) Filed: Jan. 21, 2022

(65) Prior Publication Data

US 2022/0406891 A1 Dec. 22, 2022

(30) Foreign Application Priority Data

Jun. 16, 2021 (KR) .................. 10-2021-0077987

(51) Int. Cl.
*H01L 29/06* (2006.01)
*H01L 29/423* (2006.01)
*H01L 29/78* (2006.01)

(52) U.S. Cl.
CPC .... *H01L 29/0653* (2013.01); *H01L 29/42376* (2013.01); *H01L 29/7816* (2013.01)

(58) Field of Classification Search
None
See application file for complete search history.

(56) References Cited

U.S. PATENT DOCUMENTS 8,067,293 B2   11/2011   Park
8,174,071 B2   5/2012   Tien et al.
(Continued)

FOREIGN PATENT DOCUMENTS

CN    103367149    10/2013
JP    2005-183633   7/2005
(Continued)

OTHER PUBLICATIONS

European Search Report Dated Aug. 16, 2022 in corresponding Application No. EP 22 157 988.1.
(Continued)

*Primary Examiner* — William C Trapanese
(74) *Attorney, Agent, or Firm* — F. Chau & Associates, LLC

(57) ABSTRACT

A semiconductor device includes a substrate, a gate electrode disposed on an upper surface of the substrate, a source region disposed on a first side of the gate electrode, a drain region disposed on a second side of the gate electrode opposite to the first side of the gate electrode in a horizontal direction, and an insulating structure at least partially buried inside the substrate on the substrate. The insulating structure includes a first portion disposed between the substrate and the gate electrode, and a second portion in contact with the drain region. An uppermost surface of the second portion of the insulating structure is lower than an uppermost surface of the first portion of the insulating structure. At least a part of the gate electrode is disposed on the uppermost surface of the second portion of the insulating structure.

19 Claims, 30 Drawing Sheets

(56) References Cited

U.S. PATENT DOCUMENTS

| | | |
|---|---|---|
| 9,871,133 B2 | 1/2018 | Ng et al. |
| 10,411,115 B2 | 9/2019 | Jung et al. |
| 10,505,038 B2 | 12/2019 | Lee et al. |
| 10,529,812 B1 | 1/2020 | Edwards |
| 10,910,377 B2 | 2/2021 | Zhang |
| 11,024,722 B1 | 6/2021 | Wang et al. |
| 2010/0270616 A1 | 10/2010 | Yanagi |
| 2014/0117444 A1 | 5/2014 | Liu et al. |
| 2015/0349050 A1* | 12/2015 | Fang .................. H01L 29/7825 |
| | | 438/270 |

FOREIGN PATENT DOCUMENTS

| | | | |
|---|---|---|---|
| JP | 2005183633 A * | 7/2005 | ..... H01L 21/823892 |
| JP | 5211652 | 6/2009 | |
| KR | 10-0289056 | 7/1999 | |

OTHER PUBLICATIONS

First Office Action Dated Aug. 26, 2022 in corresponding Application No. EP 22 157 988.1.

* cited by examiner

SEMICONDUCTOR DEVICE

CROSS-REFERENCE TO RELATED APPLICATION

This U.S. non-provisional patent application claims priority under 35 U.S.C. § 119 to Korean Patent Application No. 10-2021-0077987 filed on Jun. 16, 2021 in the Korean Intellectual Property Office, the disclosure of which is incorporated by reference in its entirety herein.

1. TECHNICAL FIELD

The present disclosure relates to a semiconductor device.

2. DISCUSSION OF RELATED ART

A metal-oxide-semiconductor field-effect transistor (MOSFET) is a type of field effect transistor that may be fabricated by the controlled oxidation of a semiconductor. A power MOSFET is a specific type of MOSFET designed to handle significant power levels. As compared to a bipolar transistor, a power MOS transistor has a larger power gain, a less complex gate drive circuit simple, and there is no time delay due to accumulation or recombination of minority carriers generated during a turn-off operation. Therefore, the power MOS transistor is widely used as control, logic, and power switch.

A power MOS transistor may include a double-diffused MOS (DMOS) transistor, a laterally diffused MOS (LD-MOS) transistor, or a drain extended MOS (DEMOS) transistor.

SUMMARY

At least one embodiment of the present disclosure provides a semiconductor device with increased reliability by etching a part of an insulating structure adjacent to a drain region, and dispersing an electric field formed at an edge portion of the insulating structure adjacent to a source region to an edge portion of the insulating structure adjacent to the drain region.

According to an exemplary embodiment of the present disclosure, there is provided a semiconductor device including a substrate, a gate electrode disposed on an upper surface of the substrate, a source region disposed on a first side of the gate electrode, a drain region disposed on a second side of the gate electrode opposite to the first side of the gate electrode in a horizontal direction, and an insulating structure at least partially buried inside the substrate on the substrate. The insulating structure includes a first portion disposed between the substrate and the gate electrode, and a second portion in contact with the drain region. An uppermost surface of the second portion of the insulating structure is lower than an uppermost surface of the first portion of the insulating structure. At least a part of the gate electrode is disposed on the uppermost surface of the second portion of the insulating structure.

According to an exemplary embodiment of the present disclosure, a semiconductor device includes a substrate, a gate electrode disposed on an upper surface of the substrate, a source region disposed on a first side of the gate electrode, a drain region disposed on a second side of the gate electrode opposite to the first side of the gate electrode in a horizontal direction, an insulating structure disposed in the substrate, a gate insulating layer, and a gate spacer. The insulating structure includes a first portion disposed between the substrate and the gate electrode, and a second portion in contact with the drain region. The gate insulating layer is disposed between the upper surface of the substrate and the gate electrode, and between an uppermost surface of the first portion of the insulating structure and the gate electrode. The gate spacer is disposed on each of the first side and the second side of the gate electrode. An uppermost surface of the second portion of the insulating structure is lower than the uppermost surface of the first portion of the insulating structure. The gate spacer disposed on the second side of the gate electrode is in contact with the uppermost surface of the second portion of the insulating structure.

According to an exemplary embodiment of the present disclosure, there is provided a semiconductor device including a substrate, a gate electrode disposed on an upper surface of the substrate, a source region disposed on a first side of the gate electrode, a drain region disposed on a second side of the gate electrode opposite to the first side of the gate electrode in a horizontal direction, an insulating structure at least partially buried inside the substrate, a gate insulating layer, a gate spacer, and a capping pattern. An uppermost surface of the insulating structure is higher than the upper surface of the substrate. The insulating structure includes a first portion disposed between the substrate and the gate electrode, and a second portion in contact with the drain region. The gate insulating layer is disposed between the upper surface of the substrate and the gate electrode and between an uppermost surface of the first portion of the insulating structure and the gate electrode, and is not disposed between an uppermost surface of the second portion of the insulating structure and the gate electrode. The gate spacer is disposed on each of the first side and the second side of the gate electrode. The capping pattern is disposed on an uppermost surface of the gate electrode and has a step shape on the insulating structure. The uppermost surface of the second portion of the insulating structure is lower than the uppermost surface of the first portion of the insulating structure. At least a part of the gate electrode is disposed on the uppermost surface of the second portion of the insulating structure, and the gate spacer disposed on the second side of the gate electrode is in contact with the uppermost surface of the second portion of the insulating structure.

BRIEF DESCRIPTION OF THE DRAWINGS

The above and other aspects and features of the present disclosure will become more apparent by describing in detail exemplary embodiments thereof referring to the attached drawings, in which.

DETAILED DESCRIPTION OF THE EMBODIMENTS

Hereinafter, a semiconductor device according to an embodiment of the present disclosure will be described referring to FIGS. 1 and 2.

Figure 1:
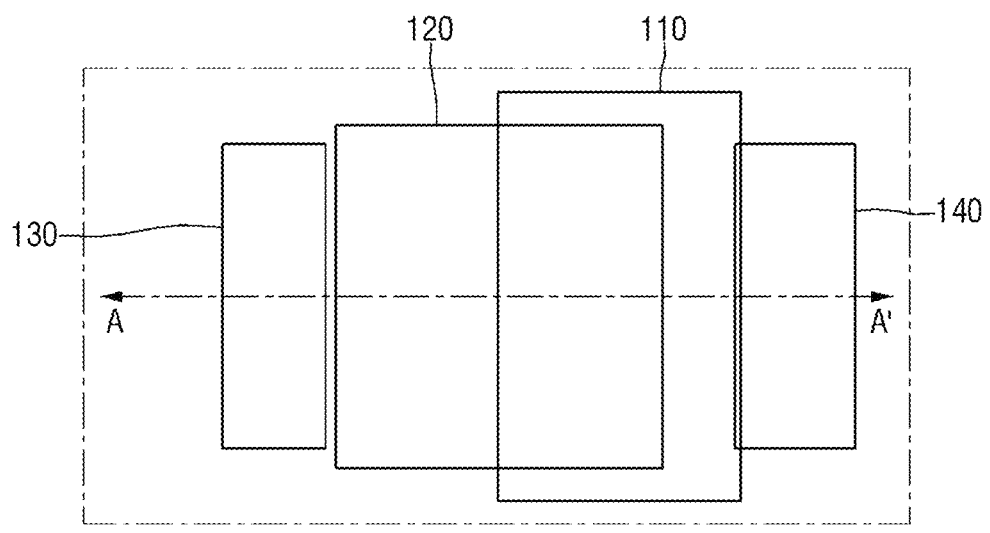
FIG. 1 is a schematic layout diagram for explaining a semiconductor device according to an embodiment of the present disclosure.

FIG. 1 is a schematic layout diagram for explaining a semiconductor device according to some embodiments of the present disclosure. FIG. 2 is a cross-sectional view taken along a line A-A' of FIG. 1.

Although the semiconductor device according to an embodiment of the present disclosure may be an LDMOS, this is only an example. For convenience of explanation, the semiconductor device according to an embodiment of the present disclosure will be described as being an n-type transistor. However, the present disclosure is not limited thereto since the present disclosure may also be applied to transistors of other forms and other conductive types.

Figure 2:
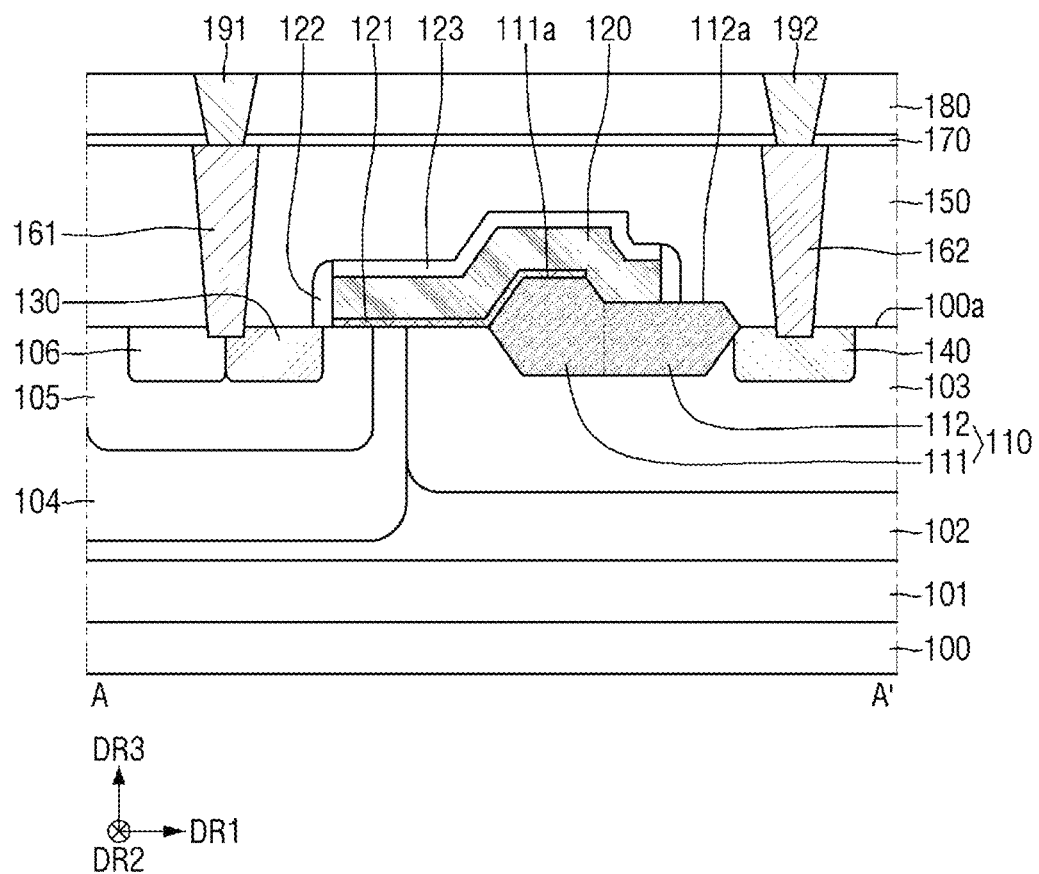
FIG. 2 is a cross-sectional view taken along a line A-A' of FIG. 1.

Referring to FIGS. 1 and 2, the semiconductor device according to an embodiment of the present disclosure includes a substrate 100, a buried layer 101, an epitaxial layer 102, a drift region 103, a well region 104, a body region 105, a body contact region 106, an insulating structure 110, a gate electrode 120, a gate insulating layer 121, a gate spacer 122, a capping pattern 123, a source region 130, a drain region 140, a first interlayer insulating layer 150, a source contact 161, a drain contact 162, an etching stop layer 170, a second interlayer insulating layer 180, a first via 191, and a second via 192.

The substrate 100 may be a semiconductor substrate doped with impurities of a first conductive type (e.g., a P type). The substrate 100 may be, for example, a silicon substrate, a gallium arsenide substrate, a silicon germanium substrate, a ceramic substrate, a quartz substrate or a glass substrate for a display, or may be a Semiconductor On Insulator (SOI) substrate. However, the disclosure is not limited thereto.

FIG. 2 shows that the buried layer 101, the epitaxial layer 102, the drift region 103, the well region 104, the body region 105, the body contact region 106, the source region 130 and the drain region 140 are each disposed on the substrate 100. However, this is because FIG. 2 shows cross sections of some regions. Hereinafter, the description will be provided on the premise that the buried layer 101, the epitaxial layer 102, the drift region 103, the well region 104, the body region 105, the body contact region 106, the source region 130 and the drain region 140 are each disposed inside the substrate 100.

The buried layer 101 may be disposed inside the substrate 100. The buried layer 101 may be doped with impurities of a second conductive type (e.g., an N type) different from the first conductive type.

The epitaxial layer 102 may be disposed on the buried layer 101 inside the substrate 100. The epitaxial layer 102 may be doped with impurities of the second conductive type (e.g., the N type). In an embodiment, a concentration of impurities of the second conductive type doped in the epitaxial layer 102 is lower than the concentration of impurities of the second conductive type doped in the buried layer 101.

The drift region 103 may be disposed inside the epitaxial layer 102. The drift region 103 may be doped with impurities of the second conductive type (e.g., the N type). In an embodiment, a concentration of impurities of the second conductive type doped in the drift region 103 is higher than the concentration of impurities of the second conductive type doped in the epitaxial layer 102.

The well region 104 may be disposed inside the epitaxial layer 102. For example, the well region 104 may be disposed directly adjacent to the drift region 103. The well region 104 may be doped with impurities of the first conductive type (e.g., the P type). In an embodiment, a depth of the well region 104 in a vertical direction DR3 is greater than a depth of the drift region 103 in the vertical direction DR3. However, the present disclosure is not limited thereto. For example, a bottom surface of the well region 104 may be lower than a bottom surface of the drift region 103.

The body region 105 may be disposed inside the well region 104. For example, the body region 105 may be spaced apart from the drift region 103 in a first horizontal direction DR1. The body region 105 may be doped with impurities of the first conductive (e.g., the P type). In an embodiment, a concentration of impurities of the first conductive type doped in the body region 105 is higher than the concentration of impurities of the first conductive type doped in the well region 104. For example, the well region 104 may surround the body region 105.

The body contact region 106 may be disposed inside the body region 105. The body contact region 106 may be doped with impurities of the first conductive type (e.g., the P type). In an embodiment, a concentration of impurities of the first conductive type doped in the body contact region 106 is higher than the concentration of impurities of the first conductive type doped in the body region 105. For example, the body region 105 may surround the body contact region 106.

For example, upper surfaces of each of the buried layer 101, the epitaxial layer 102, the drift region 103, the well region 104, the body region 105 and the body contact region 106 may be defined as being formed on the same plane as an upper surface 100a of the substrate 100.

The gate electrode 120 may be disposed on the upper surface 100a of the substrate 100. The gate electrode 120 may be disposed on the well region 104, the body region 105 and the drift region 103. At least a part of the gate electrode 120 may be disposed on an insulating structure 110 to be described below. The gate electrode 120 may extend in a second horizontal direction DR2 different from the first horizontal direction DR1. The upper surface of the gate electrode 120 may have a step. For example, the gate electrode 120 may have a step shape. For example, the upper surface of the gate electrode 120 disposed on the well region 104 and the body region 105 may be formed to be lower than the upper surface of the gate electrode 120 disposed on the insulating structure 110.

The gate electrode 120 may include, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and combinations thereof. The gate electrode 120 may include polysilicon, a conductive metal oxide, a conductive metal oxynitride, and the like, and may also include an oxidized form of the above-mentioned materials.

The source region 130 may be disposed inside the body region 105. For example, the body region 105 may surround the source region 130. The source region 130 may be disposed on a first side of the gate electrode 120 in the first horizontal direction DR1. The source region 130 may extend in the second horizontal direction DR2. For example, the upper surface of the source region 130 may be formed on the same plane as the upper surface 100*a* of the substrate 100.

Although FIG. 2 shows that the source region 130 is in contact with the body contact region 106, the present disclosure is not limited thereto. In an embodiment, the source region 130 is spaced apart from the body contact region 106. The source region 130 may be doped with impurities of the second conductive type (e.g., the N type).

The drain region 140 may be disposed inside the drift region 103. For example, the drift region 103 may surround the drain region 140. The drain region 140 may be disposed on a second side of the gate electrode 120 opposite to the first side of the gate electrode 120 in the first horizontal direction DR1. The drain region 140 may extend in a second horizontal direction DR2. For example, the upper surface of the drain region 140 may be formed on the same plane as the upper surface 100*a* of the substrate 100. The drain region 140 may be doped with impurities of the second conductive type (e.g., the N type).

The insulating structure 110 may be disposed on the substrate 100. For example, the insulating structure 110 may be disposed on the drift region 103. At least a part of the insulating structure 110 may be buried inside the substrate 100. For example, at least a part of the insulating structure 110 may be buried inside the drift region 103. A part of the insulating structure 110 may be disposed between the substrate 100 and the gate electrode 120. For example, a part of the insulating structure 110 may be disposed between the drift region 103 and the gate electrode 120. At least a part of the insulating structure 110 may protrude from the upper surface 100*a* of the substrate 100 in the vertical direction DR3. The insulating structure 110 may extend in the second horizontal direction DR2.

The insulating structure 110 may include a first portion 111, and a second portion 112 that is in contact with the first portion 111. The first portion 111 of the insulating structure 110 may be disposed between the substrate 100 and the gate electrode 120. For example, the first portion 111 of the insulating structure 110 may be disposed between the drift region 103 and the gate electrode 120. The second portion 112 of the insulating structure 110 may be disposed between the first portion 111 of the insulating structure 110 and the drain region 140. The second portion 112 of the insulating structure 110 may be in contact with the drain region 140.

In an embodiment, an uppermost surface 111*a* of the first portion 111 of the insulating structure 110 is formed to be higher than the upper surface 100*a* of the substrate 100. In an embodiment, an uppermost surface 112*a* of the second portion 112 of the insulating structure 110 is formed to be higher than the upper surface 100*a* of the substrate 100. In an embodiment, the uppermost surface 112*a* of the second portion 112 of the insulating structure 110 is formed to be lower than the uppermost surface 111*a* of the first portion 111 of the insulating structure 110. The insulating structure 110 may include an insulating material. The insulating structure 110 may include, for example, silicon oxide.

The gate electrode 120 may be disposed on the uppermost surface 111*a* of the first portion 111 of the insulating structure 110. The gate electrode 120 may be disposed on at least a part of the uppermost surface 112*a* of the second portion 112 of the insulating structure 110. In an embodiment, the gate electrode 120 is not disposed on the remaining part of the uppermost surface 112*a* of the second portion 112 of the insulating structure 110. That is, the gate electrode 120 may be disposed on the remaining part of the uppermost surface 112*a* of the second portion 112 of the insulating structure 110, between the first portion 111 of the insulating structure 110 and the drain region 140.

The gate insulating layer 121 may be disposed between the upper surface 100*a* of the substrate 100 and the gate electrode 120. The gate insulating layer 121 may be disposed between the uppermost surface 111*a* of the first portion 111 of the insulating structure 110 and the gate electrode 120. Further, the gate insulating layer 121 may be disposed on one side wall of the first portion 111 of the insulating structure 110 that connects the upper surface 100*a* of the substrate 100 and the uppermost surface 111*a* of the first portion 111 of the insulating structure 110.

In an embodiment, the gate insulating layer 121 is not disposed on the uppermost surface 112*a* of the second portion 112 of the insulating structure 110. In an embodiment, the gate insulating layer 121 is not disposed on the other side wall of the first portion 111 of the insulating structure 110 that connects the uppermost surface 111*a* of the first portion 111 of the insulating structure 110 and the uppermost surface 112*a* of the second portion 112 of the insulating structure 110.

The gate insulating layer 121 may include, for example, silicon oxide, silicon oxynitride, silicon nitride, and a high dielectric material having a higher dielectric constant than silicon oxide. The high dielectric material may include, for example, but is not limited to, at least one of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and combinations thereof.

The gate spacer 122 may be disposed on either side of the gate electrode 120 in the first horizontal direction DR1. That is, the gate spacer 122 may be disposed on each of the first side of the gate electrode 120 adjacent to the source region 130 and the second side of the gate electrode 120 adjacent to the drain region 140. The gate spacer 122 may extend in the second horizontal direction DR2.

For example, the gate spacer 122 disposed on the first side of the gate electrode 120 adjacent to the source region 130 may be in contact with the upper surface of the source region 130. The gate spacer 122 disposed on the second side of the gate electrode 120 adjacent to the drain region 140 may be disposed on the uppermost surface 112a of the second portion 112 of the insulating structure 110. The gate spacer 122 disposed on the second side of the gate electrode 120 adjacent to the drain region 140 may be in contact with the uppermost surface 112a of the second portion 112 of the insulating structure 110.

The gate spacer 122 may include, for example, at least one of silicon nitride (SiN), silicon oxynitride (SiON), silicon oxide (SiO$_2$), silicon oxycarbonitride (SiOCN), silicon boronitride (SiBN), silicon oxyboronitride (SiOBN), silicon oxycarbide (SiOC), and combinations thereof.

The capping pattern 123 may be disposed on the upper surface of the gate electrode 120. The capping pattern 123 may be disposed between the gate spacers 122. For example, the capping pattern 123 may contact the gate spacers 122 and the gate electrode 120. For example, the capping pattern 123 may be formed conformally. The capping pattern 123 may have a step on the insulating structure 110. For example, the capping pattern 123 may have a step shape. The capping pattern 123 may include, for example, at least one of silicon nitride (SiN), silicon oxynitride (SiON), silicon oxide (SiO$_2$), silicon carbonitride (SiCN), silicon oxycarbonitride (SiOCN), and combinations thereof.

The first interlayer insulating layer 150 may be disposed on the upper surface 100a of the substrate 100. The first interlayer insulating layer 150 may cover the upper surface of the drift region 103, the upper surface of the body region 105, the upper surface of the body contact region 106, the upper surface of the source region 130, the upper surface of the drain region 140, the exposed insulating structure 110, the gate spacers 122 and the capping pattern 123.

The first interlayer insulating layer 150 may include, for example, at least one of silicon oxide, silicon nitride, silicon oxynitride and a low dielectric constant material. The low dielectric constant material may include, for example, Fluorinated TetraEthylOrthoSilicate (FTEOS), Hydrogen SilsesQuioxane (HSQ), Bis-benzoCycloButene (BCB), TetraMethylOrthoSilicate (TMOS), OctaMethyleyCloTetraSiloxane (OMCTS), HexaMethylDiSiloxane (HMDS), TriMethylSilyl Borate (TMSB), DiAcetoxyDitertiaryButoSiloxane (DADBS), TriMethylSilil Phosphate (TMSP), PolyTetraFluoroEthylene (PTFE), TOSZ (Tonen SilaZen), FSG (Fluoride Silicate Glass), polyimide nanofoams such as polypropylene oxide, CDO (Carbon Doped silicon Oxide), OSG (Organo Silicate Glass), SiLK, Amorphous Fluorinated Carbon, silica aerogels, silica xerogels, mesoporous silica or combinations thereof. However, the present disclosure is not limited thereto.

The source contact 161 may penetrate the first interlayer insulating layer 150 in the vertical direction DR3 and be connected to the source region 130. In some embodiments, the source contact 161 may also be connected to the body contact region 106. However, the present disclosure is not limited thereto.

Although FIG. 2 shows that the source contact 161 is formed of a single film, this is for convenience of explanation, and the present disclosure is not limited thereto. That is, the source contact 161 may be formed of multiple films. The source contact 161 may include a conductive material.

The drain contact 162 may penetrate the first interlayer insulating layer 150 in the vertical direction DR3 and be connected to the drain region 140. Although FIG. 2 shows that the drain contact 162 is formed of a single film, this is for convenience of explanation, and the present disclosure is not limited thereto. That is, the drain contact 162 may be formed of multiple films. The drain contact 162 may include a conductive material.

The etching stop layer 170 may be disposed on the first interlayer insulating layer 150. Although FIG. 2 shows that the etching stop layer 170 is formed of a single film, the present disclosure is not limited thereto. In some other embodiments, the etching stop layer 170 may be formed of multiple films. The etching stop layer 170 may include, for example, at least one of silicon oxide, silicon nitride, silicon oxynitride and a low dielectric constant material.

The second interlayer insulating layer 180 may be disposed on the etching stop layer 170. The second interlayer insulating layer 180 may include, for example, at least one of silicon oxide, silicon nitride, silicon oxynitride, and a low dielectric constant material.

The first via 191 may penetrate the second interlayer insulating layer 180 and the etching stop layer 170 in the vertical direction DR3 and be connected to the source contact 161. Although FIG. 2 shows that the first via 191 is formed of a single film, this is for convenience of explanation, and the present disclosure is not limited thereto. That is, the first via 191 may be formed of multiple films. The first via 191 may include a conductive material.

The second via 192 may penetrate the second interlayer insulating layer 180 and the etching stop layer 170 in the vertical direction DR3, and be connected to the drain contact 162. Although FIG. 2 shows that the second via 192 is formed of a single film, this is for convenience of explanation, and the present disclosure is not limited thereto. That is, the second via 192 may be formed of multiple films. The second via 192 may include a conductive material.

In the semiconductor device according to an embodiment of the present disclosure, by etching a part of the insulating structure 110 adjacent to the drain region 140, and dispersing an electric field formed at an edge portion of the insulating structure 110 adjacent to the source region 130 to the edge portion of the insulating structure 110 adjacent to the drain region 140, the reliability of the semiconductor device can be increased.

Hereinafter, a method for fabricating a semiconductor device according to an embodiment of the present disclosure will be described referring to FIGS. 2 to 12.

FIGS. 3 to 12 are intermediate stage diagrams for explaining a method for fabricating a semiconductor device according to an embodiment of the present disclosure.

Figure 3:
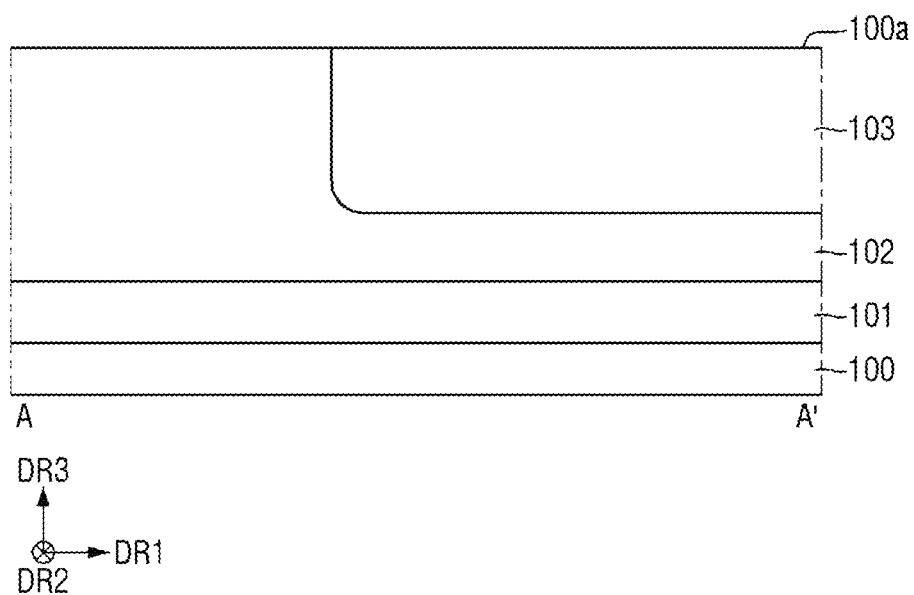
FIGS. 3 to 12 are intermediate stage diagrams for explaining a method for fabricating a semiconductor device according to an embodiment of the present disclosure.

Referring to FIG. 3, the buried layer 101 and the epitaxial layer 102 may be formed inside the substrate 100. For example, each of the buried layer 101 and the epitaxial layer 102 may be doped with N-type impurities. Subsequently, a drift region 103 may be formed inside the epitaxial layer 102. For example, the buried layer 101 and the epitaxial layer 102 may be doped with N-type impurities.

Figure 4:
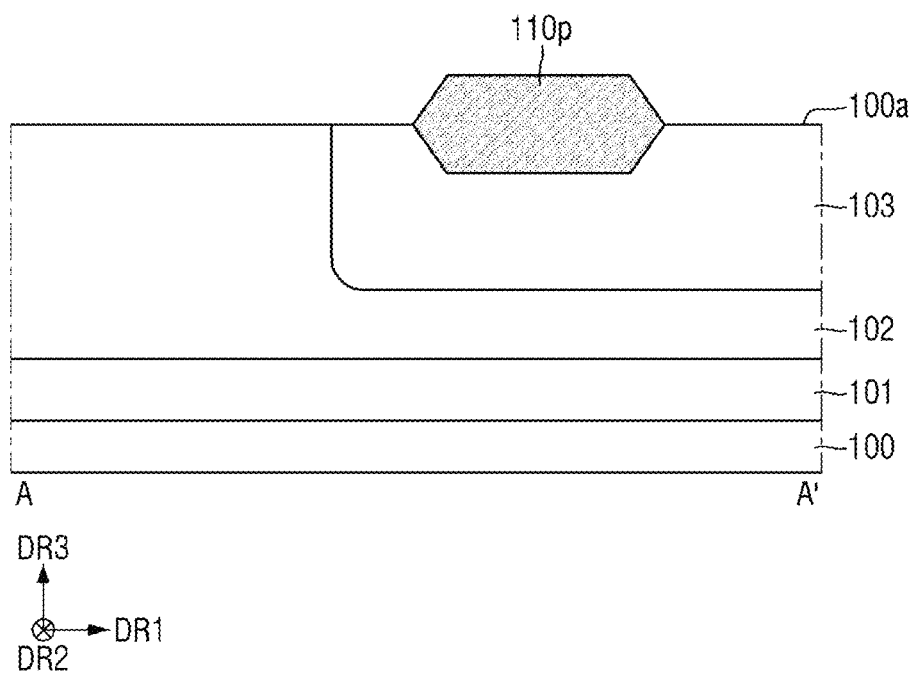

Referring to FIG. 4, a pre-insulating structure 110p may be formed on the drift region 103. At least a part of the pre-insulating structure 110p may be buried in the drift region 103. For example, a lower surface of the pre-insulating structure 110p may be lower than the upper surface 100a.

Figure 5:
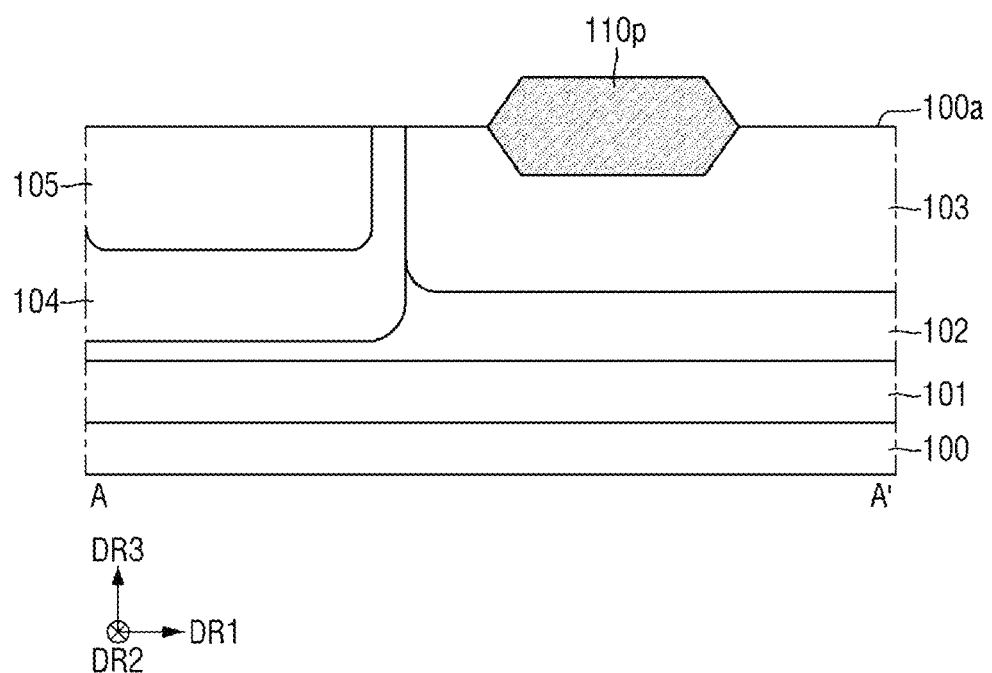

Referring to FIG. 5, the well region 104 and the body region 105 may be formed on one side of the drift region 103 inside the epitaxial layer 102. For example, each of the well region 104 and the body region 105 may be doped with P-type impurities.

Figure 6:
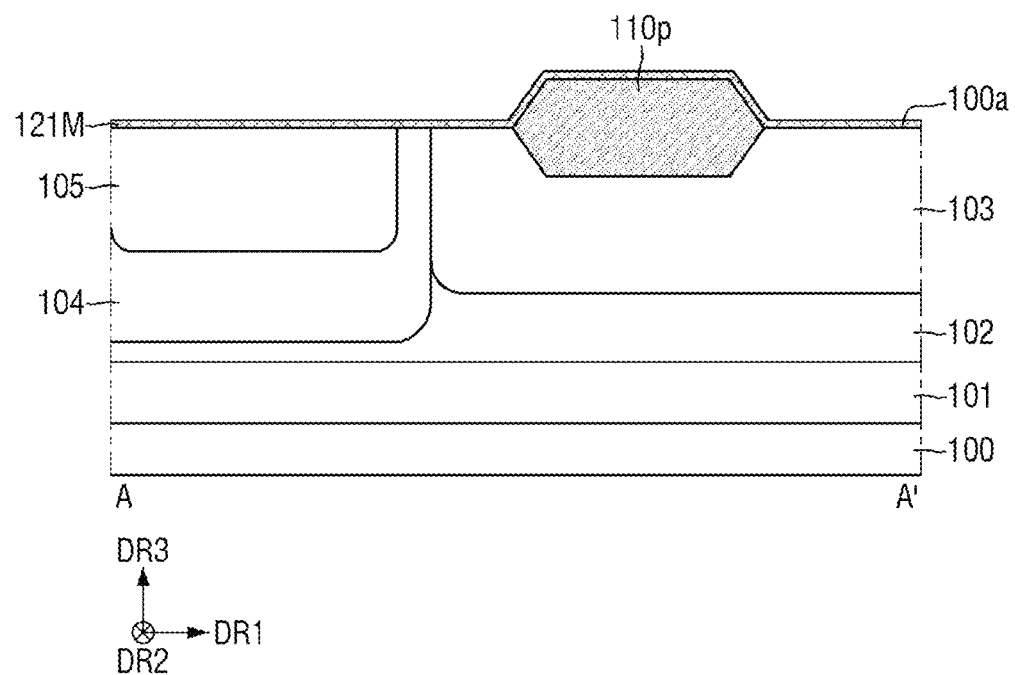

Referring to FIG. 6, a gate insulating material layer 121M may be formed on the upper surface 100a of the substrate 100. The gate insulating material layer 121M may also be formed on the insulating structure 110 exposed on the upper surface 100a of the substrate 100. For example, the gate insulating material layer 121M may be formed conformally. For example, the gate insulating material layer 121M may be formed on the pre-insulating structure 110p.

Figure 7:
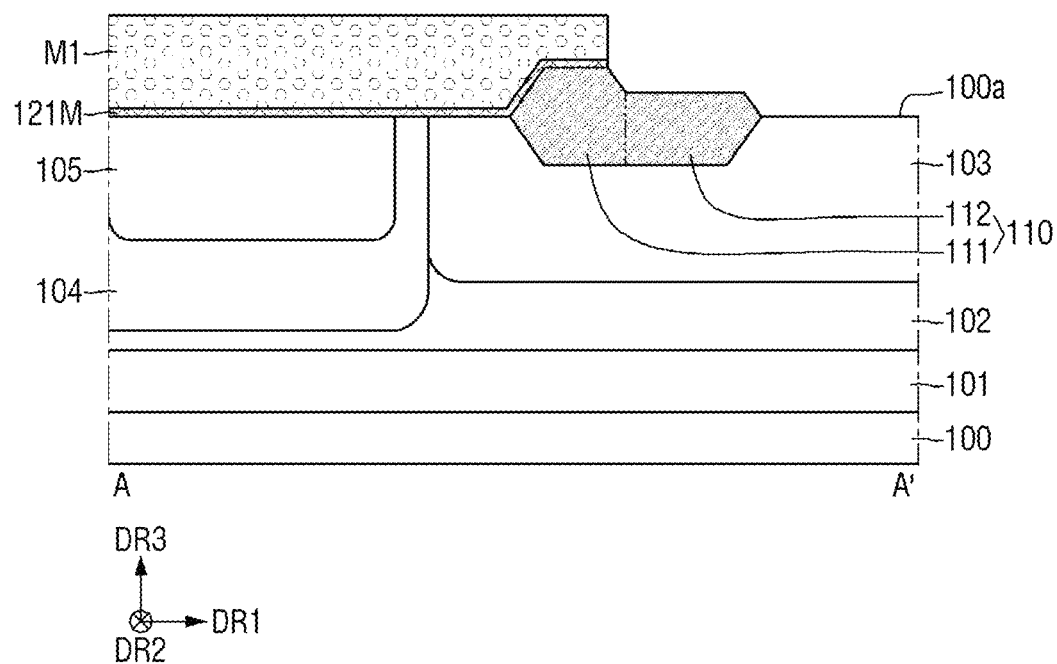

Referring to FIG. 7, a first mask pattern M1 may be formed on the well region 104, the body region 105, the drift region 103 adjacent to the pre-insulating structure (110p of FIG. 6) and a part of the pre-insulating structure (110p of FIG. 6).

Subsequently, the exposed gate insulating material layer 121M and a part of the pre-insulating structure (110p of FIG. 6) may be etched, using the first mask pattern M1 as an etching mask. The insulating structure 110 having a stepped upper surface may be formed through such an etching process.

Figure 8:
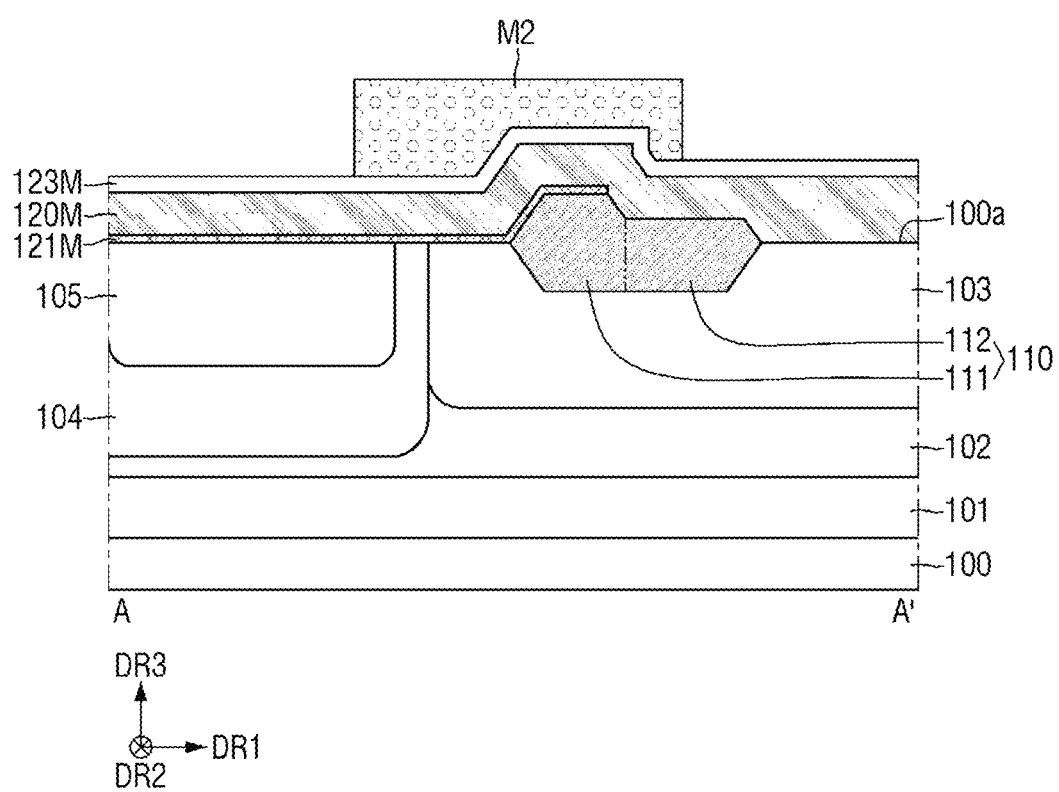

Referring to FIG. 8, after the first mask pattern M1 is removed, a gate electrode material layer 120M and a capping pattern material layer 123M may be formed sequentially on the remaining gate insulating material layer 121M, the exposed insulating structure 110 and the exposed drift region 103. For example, each of the gate electrode material layer 120M and the capping pattern material layer 123M may be formed conformally. Subsequently, a second mask pattern M2 may be formed on the capping pattern material layer 123M.

Figure 9:
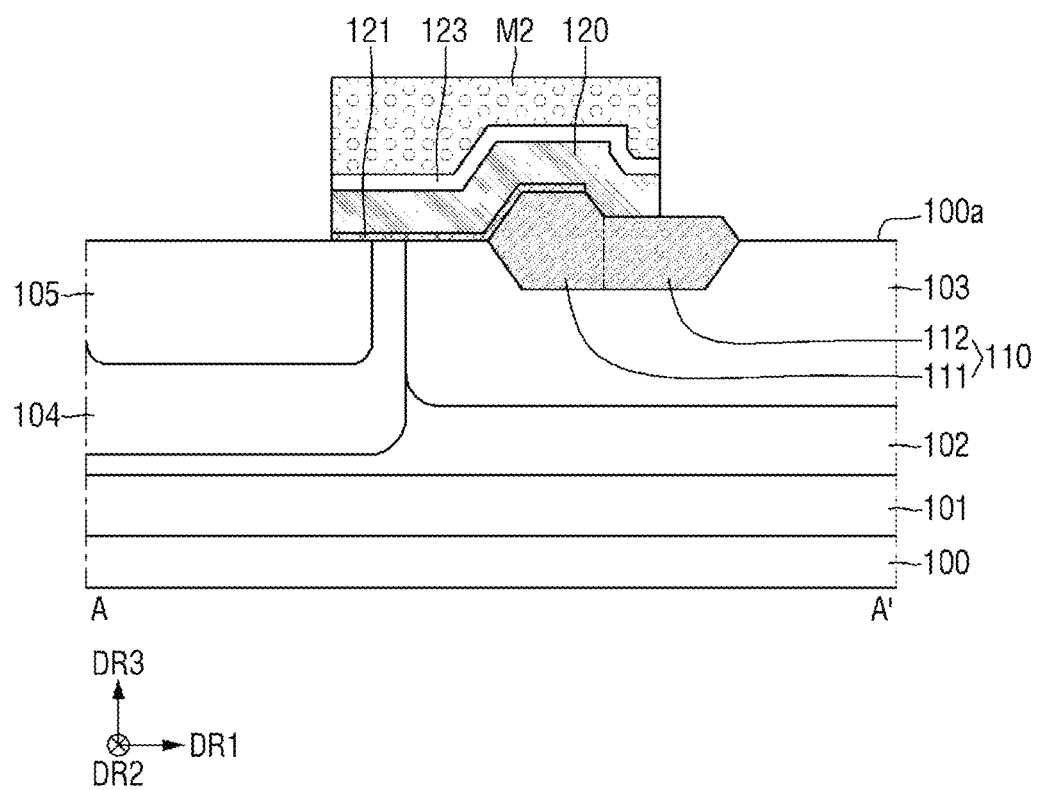

Referring to FIG. 9, a capping pattern material layer (123M of FIG. 8), a gate electrode material layer (120M of FIG. 8), and a gate insulating material layer (121M of FIG. 8) may be etched, using the second mask pattern M2 as an etching mask. The gate insulating layer 121, the gate electrode 120 and the capping pattern 123 may be formed through such an etching process.

Figure 10:
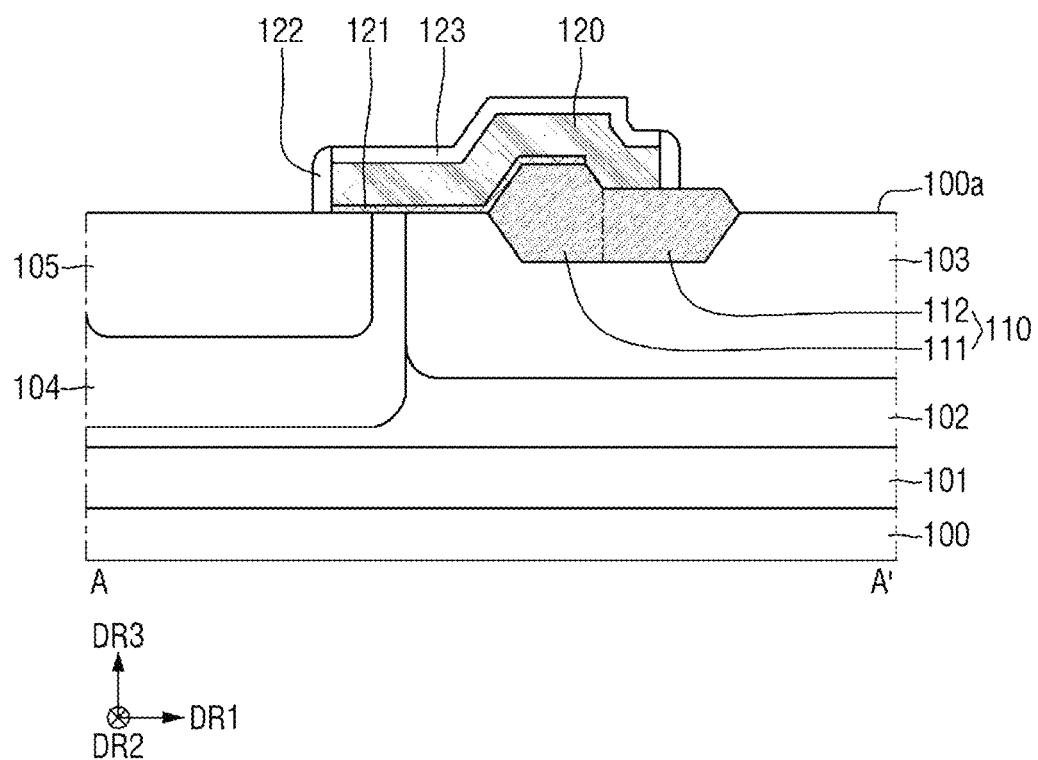

Referring to FIG. 10, after removing the second mask pattern M2, the gate spacer 122 may be formed on both sides of each of the gate insulating layer 121, the gate electrode 120 and the capping pattern 123.

The gate spacer 122 formed on the first side of the gate electrode 120 may be in contact with the upper surface of the body region 105. The gate spacer 122 formed on the second side of the gate electrode 120 opposite to the first side of the gate electrode 120 in the first horizontal direction DR1 may be in contact with the uppermost surface (112a of FIG. 2) of the second portion 112 of the insulating structure 110.

Figure 11:
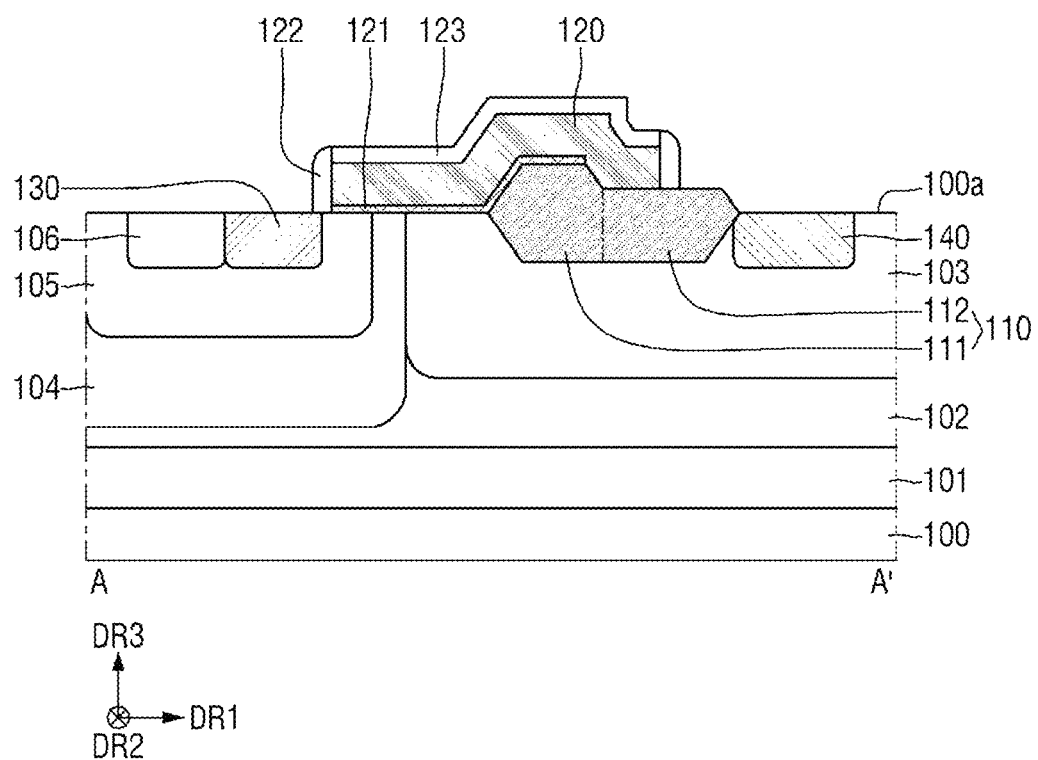

Referring to FIG. 11, a body contact region 106 and a source region 130 may be formed inside the body region 105 on the first side of the gate electrode 120. For example, the body contact region 106 may be doped with P-type impurities and the source region 130 may be doped with N-type impurities. For example, a doping process may be applied to different portions of the body region 105 to form the body contact region 106 and the source region 130.

Further, the drain region 140 may be formed inside the drift region 103 on the second side of the gate electrode 120. The drain region 140 may be formed to be in contact with the second portion 112 of the insulating structure 110. The drain region 140 may be doped with N-type impurities. For example, a doping process may be applied to a portion of the drift region 103 to form the drain region 140.

Figure 12:
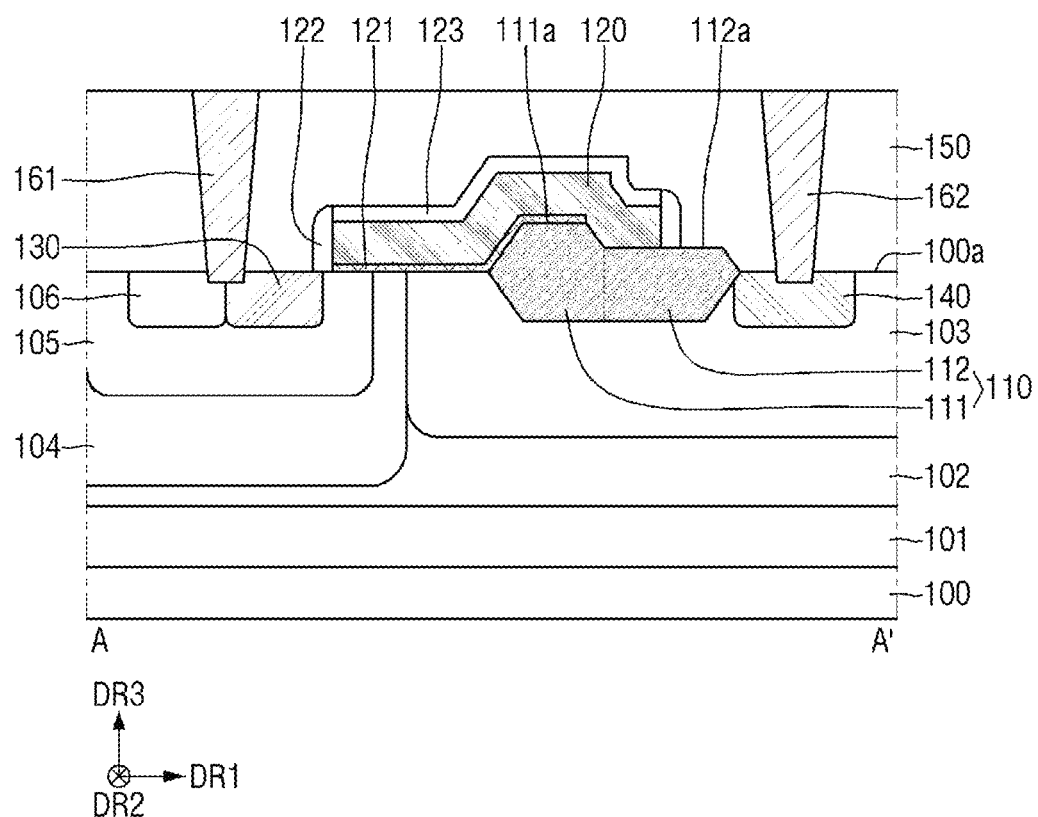

Referring to FIG. 12, the first interlayer insulating layer 150 may be formed to cover the upper surface of the drift region 103, the upper surface of the body region 105, the upper surface of the body contact region 106, the upper surface of the source region 130, the upper surface of the drain region 140, the exposed insulating structure 110, the gate spacer 122 and the capping pattern 123.

Subsequently, a source contact 161 which penetrates the first interlayer insulating layer 150 in the vertical direction DR3 and is connected to the body contact region 106 and the source region 130 may be formed. Further, a drain contact 162 which penetrates the first interlayer insulating layer 150 in the vertical direction DR3 and is connected to the drain region 140 may be formed. For example, a first hole may be formed by creating a first through-hole in the first interlayer insulating layer 150 and creating recesses in upper surfaces of the body contact region 106 and the source region 130, and the source contact 161 may be deposited in the first hole. For example, a second hole may be formed by creating a second through-hole in the first interlayer insulating layer 150 and creating a recess in an upper surface of the drain region 140, and the drain contact 162 may be deposited in the second hole.

Referring to FIG. 2, the etching stop layer 170 and the second interlayer insulating layer 180 may be sequentially formed on the first interlayer insulating layer 150, the source contact 161 and the drain contact 162. Subsequently, a first via 191 which penetrates the second interlayer insulating layer 180 and the etching stop layer 170 in the vertical direction DR3 and is connected to the source contact 161 may be formed. Further, a second via 192 which penetrates the second interlayer insulating layer 180 and the etching stop layer 170 in the vertical direction DR3 and is connected to the drain contact 162 may be formed. The semiconductor device shown in FIG. 2 may be fabricated through such a fabricating method.

Hereinafter, a semiconductor device according to an embodiment of the present disclosure will be described referring to FIG. 13. Differences from the semiconductor device shown in FIGS. 1 and 2 will be mainly described.

Figure 13:
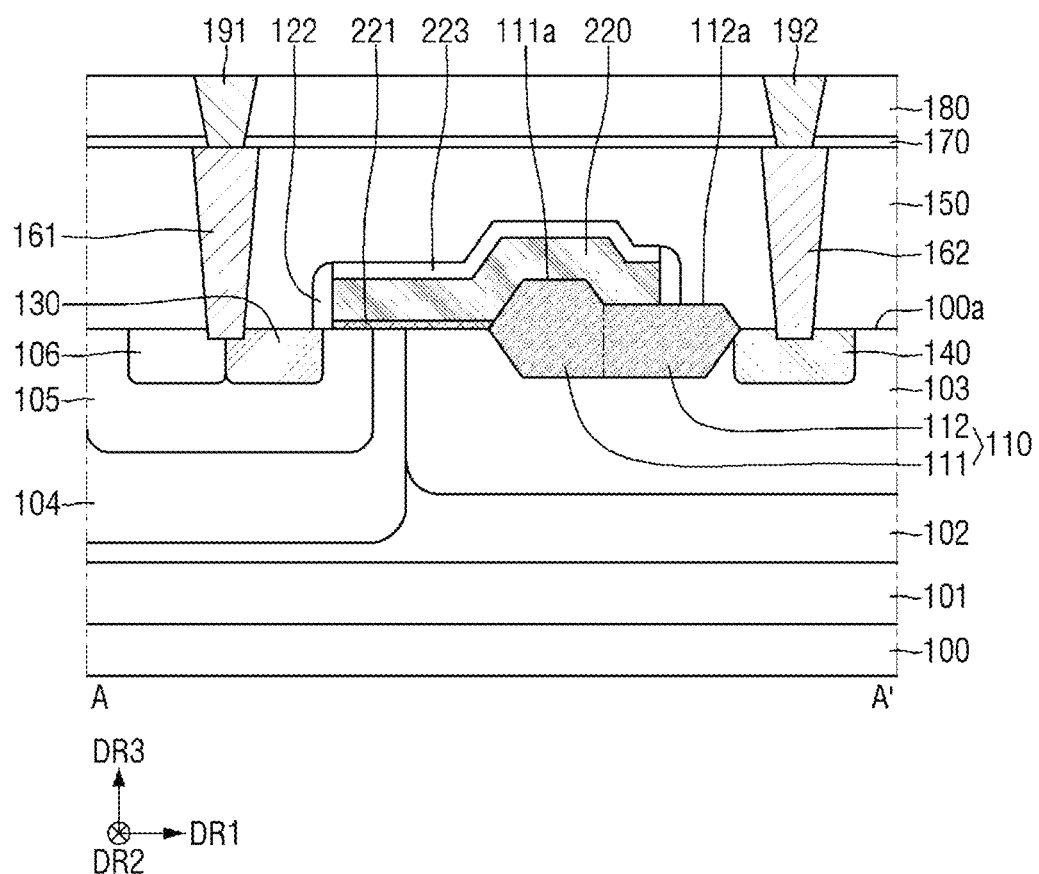
FIG. 13 is a cross-sectional view for explaining a semiconductor device according to an embodiment of the present disclosure.

FIG. 13 is a cross-sectional view for explaining a semiconductor device according to an embodiment of the present disclosure.

Referring to FIG. 13, in the semiconductor device according to an embodiment of the present disclosure, a gate insulating layer 221 is not disposed on the insulating structure 110. For example, the gate insulating layer 221 is not disposed on the uppermost surface 111a of the first portion 111 of the insulating structure 110. Further, the gate insulating layer 221 is not disposed on one side wall of the first portion 111 of the insulating structure 110 that connects the upper surface 100a of the substrate 100 and the uppermost surface 111a of the first portion 111 of the insulating structure 110.

The gate electrode 220 may be in contact with each of the first portion 111 of the insulating structure 110 and the second portion 112 of the insulating structure 110. The capping pattern 223 may be disposed on the gate electrode 220.

Hereinafter, a method for fabricating a semiconductor device according to an embodiment of the present disclosure will be described referring to FIGS. 13 to 17. Differences from the method for fabricating the semiconductor device shown in FIGS. 3 to 12 will be mainly described.

FIGS. 14 to 17 are intermediate stage diagrams for explaining a method for fabricating a semiconductor device according to an embodiment of the present disclosure.

Figure 14:
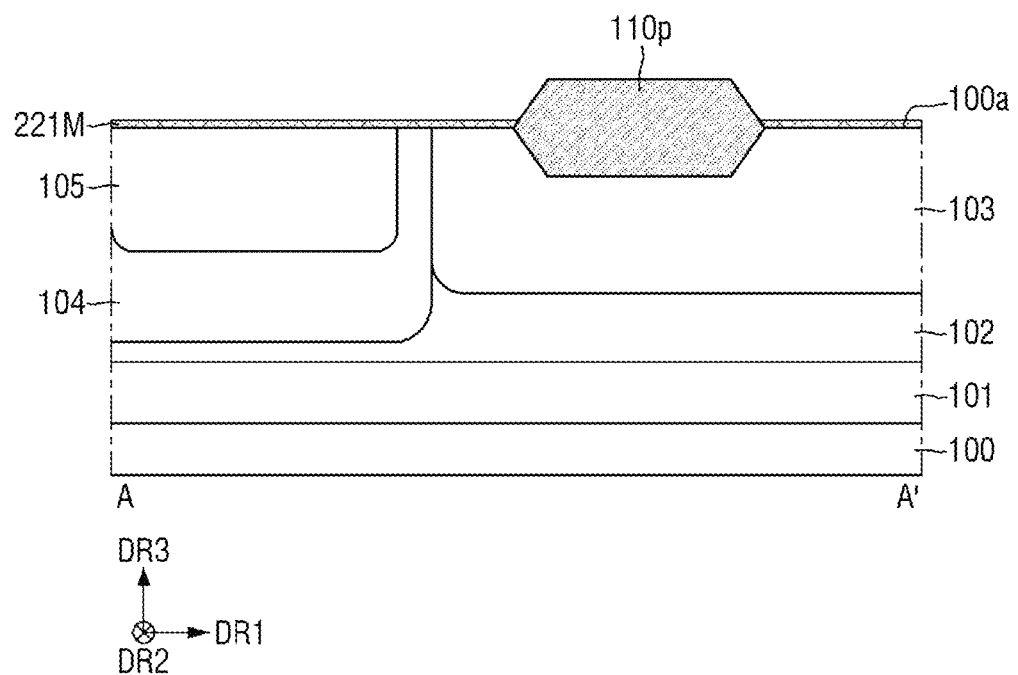
FIGS. 14 to 17 are intermediate stage diagrams for explaining a method for fabricating a semiconductor device according to an embodiment of the present disclosure.

Referring to FIG. 14, a gate insulating material layer 221M may be formed on the upper surface 100a of the substrate 100 after performing the processes shown in FIGS. 3 to 5. The gate insulating material layer 221M is not formed on the insulating structure 110 exposed on the upper surface 100a of the substrate 100. For example, the gate insulating material layer 221M may be formed by oxidizing the substrate 100. For example, the gate insulating material layer 221M does not cover an upper flat surface of the pre-insulating structure 110p and does not cover upper diagonal sides of the pre-insulating structure 110p, or only covers a small portion of the upper diagonal sides closest to the upper surface 100a.

Figure 15:
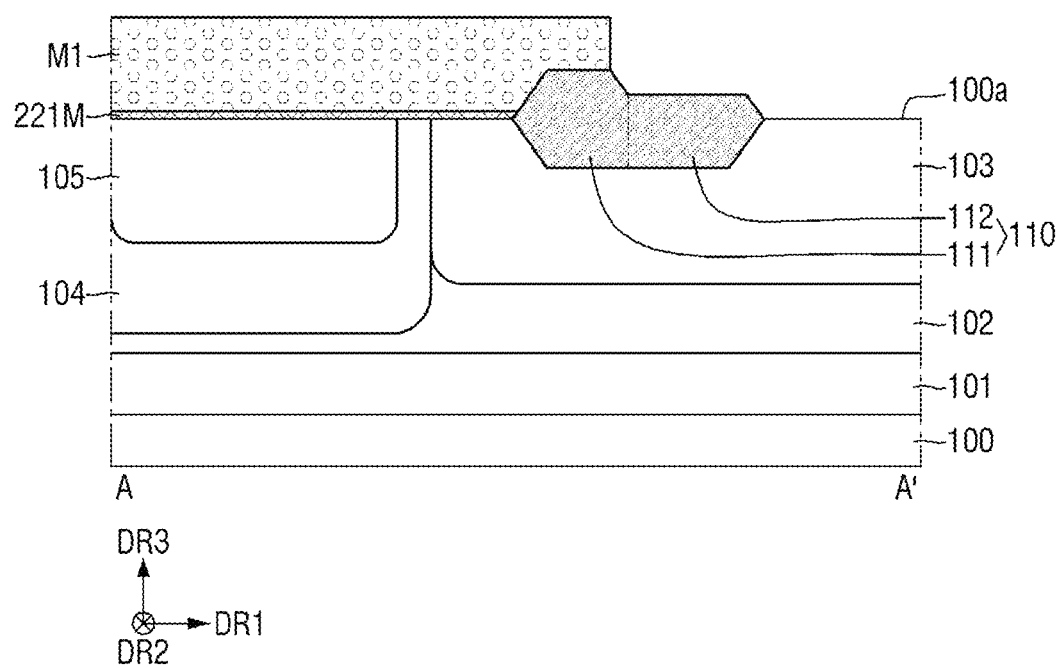

Referring to FIG. 15, a first mask pattern M1 may be formed on the well region 104, the body region 105, the drift region 103 adjacent to the pre-insulating structure (110p of FIG. 14) and a part of the pre-insulating structure (110p of FIG. 14).

Subsequently, a part of the exposed pre-insulating structure (110p of FIG. 14) may be etched, using the first mask pattern M1 as an etching mask. The insulating structure 110 having a stepped upper surface may be formed through such an etching process.

Figure 16:
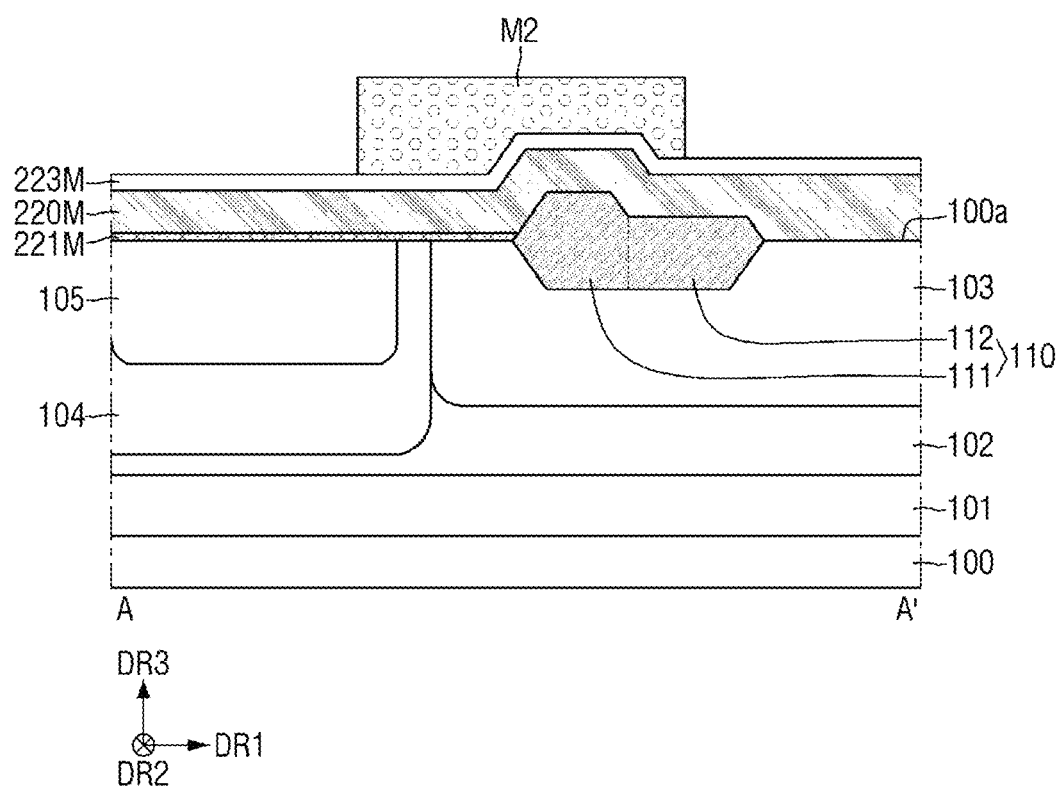

Referring to FIG. 16, after the first mask pattern M1 is removed, a gate electrode material layer 220M and a capping pattern material layer 223M may be formed sequentially on the gate insulating material layer 221M, the exposed insulating structure 110 and the exposed drift region 103. For example, each of the gate electrode material layer 220M and the capping pattern material layer 223M may be formed conformally. Subsequently, a second mask pattern M2 may be formed on the capping pattern material layer 223M.

Figure 17:
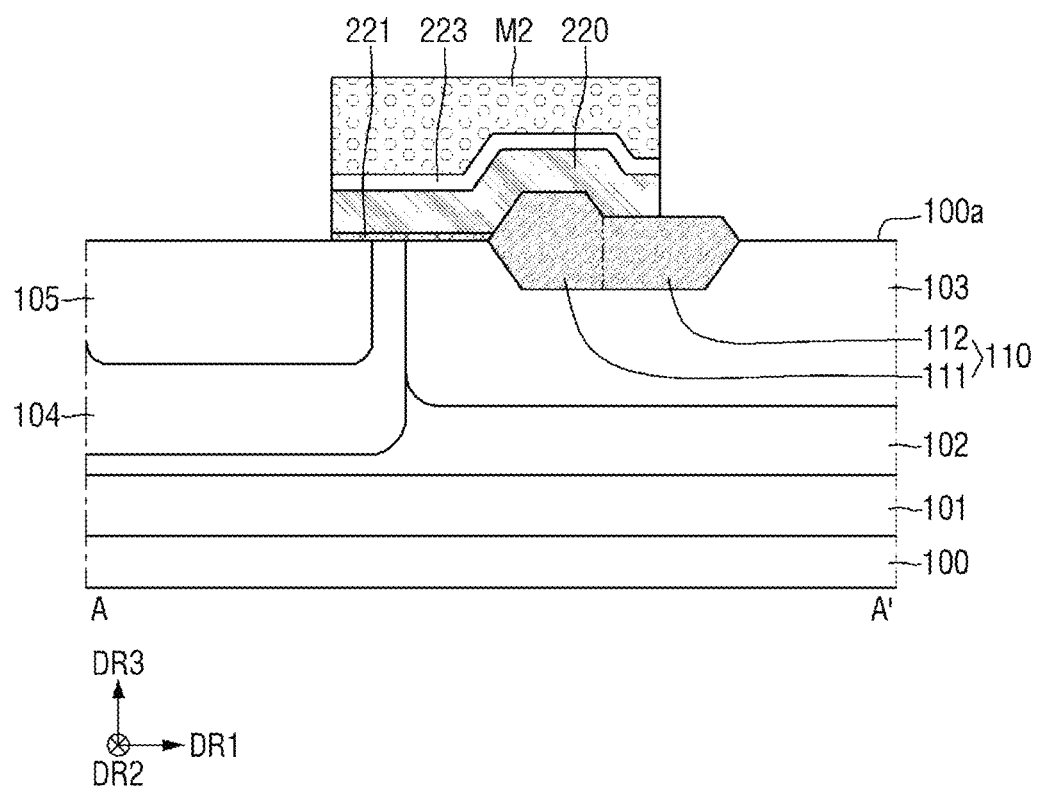

Referring to FIG. 17, a capping pattern material layer (223M of FIG. 16), a gate electrode material layer (220M of FIG. 16), and a gate insulating material layer (221M of FIG. 16) may be etched, using the second mask pattern M2 as an etching mask. The gate insulating layer 221, the gate electrode 220 and the capping pattern 223 may be formed through such an etching process.

Referring to FIG. 13, after performing the fabricating processes shown in FIGS. 9 to 12, the etching stop layer 170 and the second interlayer insulating layer 180 may be sequentially formed on the first interlayer insulating layer 150, the source contact 161 and the drain contact 162. Subsequently, the first via 191 which penetrates the second interlayer insulating layer 180 and the etching stop layer 170 in the vertical direction DR3 and is connected to the source contact 161 may be formed. Further, the second via 192 which penetrates the second interlayer insulating layer 180 and the etching stop layer 170 in the vertical direction DR3 and is connected to the drain contact 162 may be formed. The semiconductor device shown in FIG. 13 may be fabricated through such a fabricating method.

Hereinafter, a semiconductor device according to an embodiment of the present disclosure will be described referring to FIG. 18. Differences from the semiconductor device shown in FIGS. 1 and 2 will be mainly described.

Figure 18:
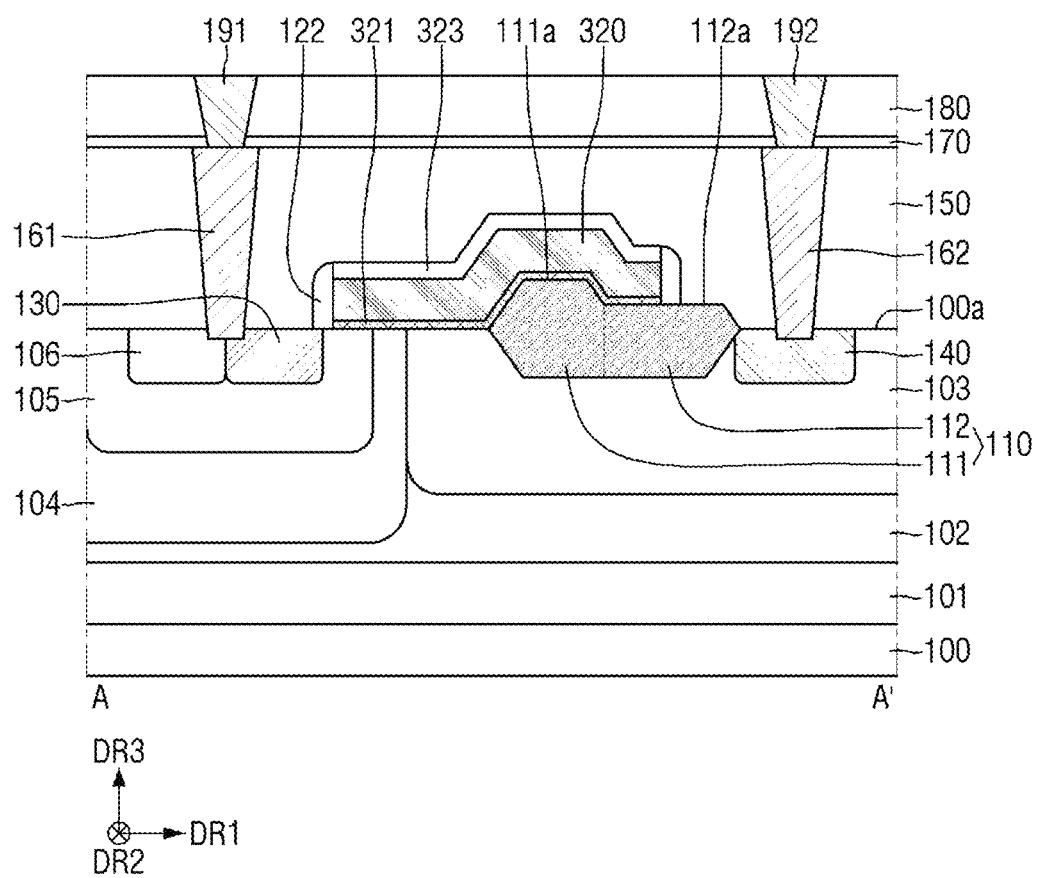
FIG. 18 is a cross-sectional view for explaining a semiconductor device according to an embodiment of the present disclosure.

FIG. 18 is a cross-sectional view for explaining a semiconductor device according to an embodiment of the present disclosure.

Referring to FIG. 18, in the semiconductor device according to an embodiment of the present disclosure, a gate insulating layer 321 may be disposed between the insulating structure 110 and a gate electrode 320. The gate insulating layer 321 may be disposed between the upper surface 100a of the substrate 100 and the gate electrode 320, between the first portion 111 of the insulating structure 110 and the gate electrode 320, and between the uppermost surface 112a of the second portion 112 of the insulating structure 110 and the gate electrode 320. A capping pattern 323 may be disposed on the gate electrode 320.

Hereinafter, a method for fabricating a semiconductor device according to an embodiment of the present disclosure will be described referring to FIGS. 18 to 21. Differences from the method for fabricating the semiconductor device shown in FIGS. 3 to 12 will be mainly described.

Figure 19:
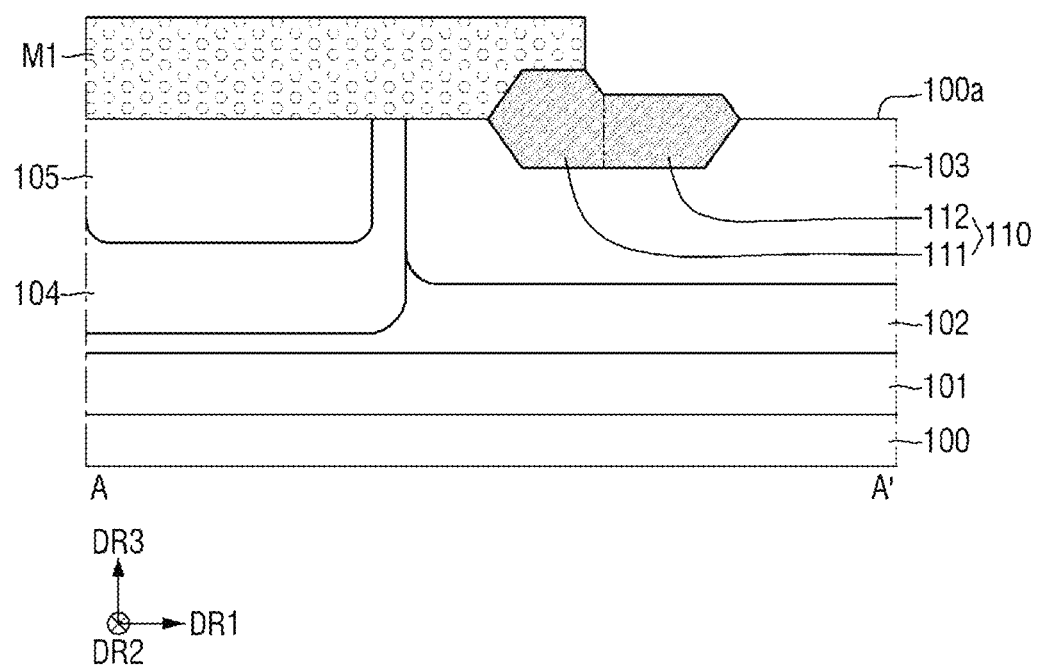
FIGS. 19 to 21 are intermediate stage diagrams for explaining a method for fabricating a semiconductor device according to an embodiment of the present disclosure.
Figure 20:
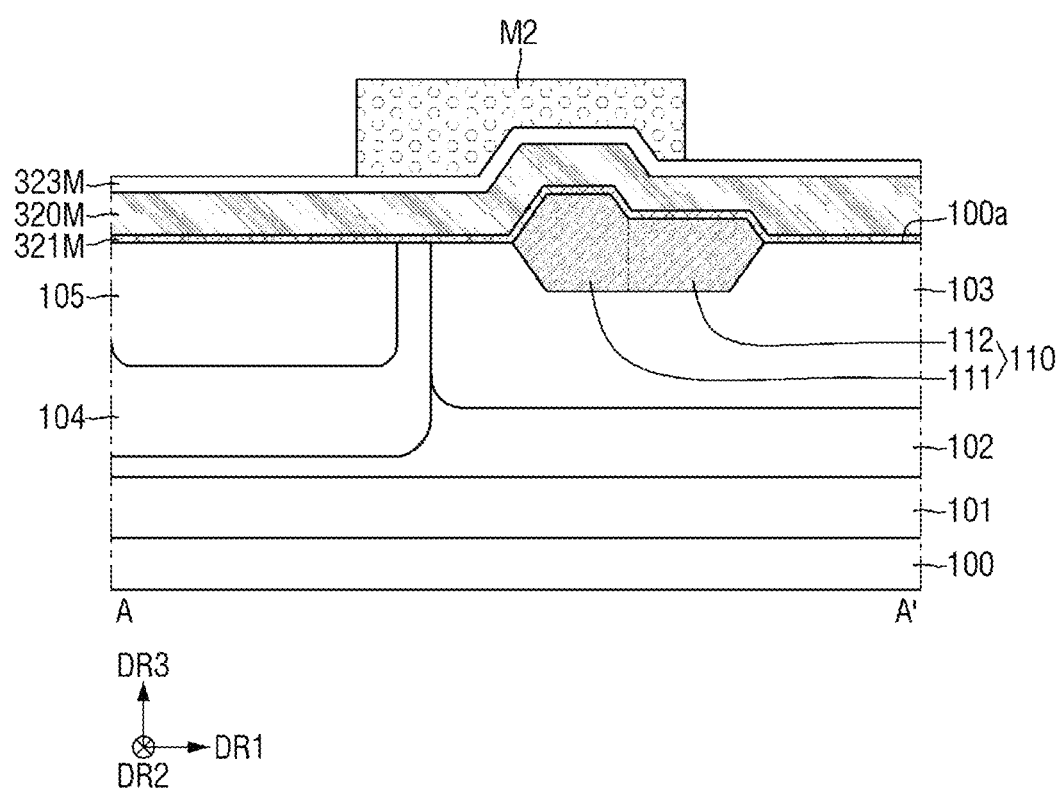
Figure 21:
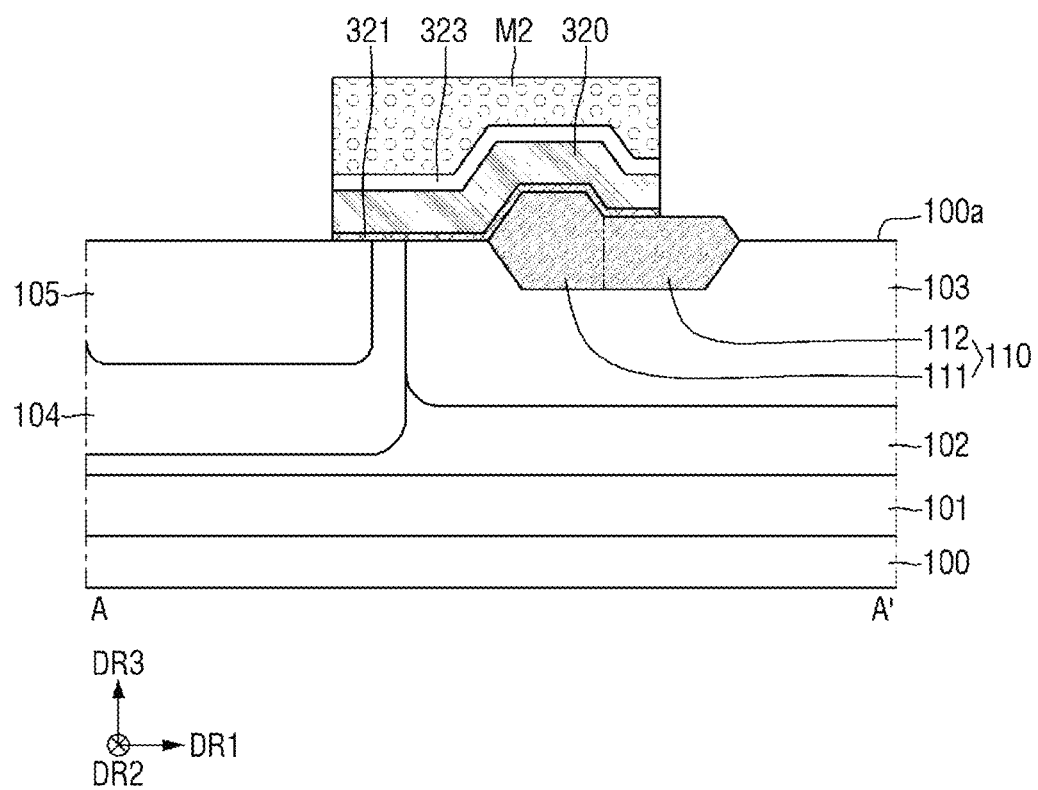

FIGS. 19 to 21 are intermediate stage diagrams for explaining a method for fabricating a semiconductor device according to an embodiment of the present disclosure.

Referring to FIG. 19, after performing the processes shown in FIGS. 3 to 5, the first mask pattern M1 may be formed on the well region 104, the body region 105, the drift region 103 adjacent to the pre-insulating structure (110p of FIG. 5), and a part of the pre-insulating structure (110p of FIG. 5).

Subsequently, a part of the exposed pre-insulating structure (110p of FIG. 5) may be etched, using the first mask pattern M1 as an etching mask. The insulating structure 110 having a stepped upper surface may be formed through such an etching process.

Referring to FIG. 20, after removing the first mask pattern M1, a gate insulating material layer 321M, a gate electrode material layer 320M and a capping pattern material layer 323M may be sequentially formed on the well region 104, the body region 105, the exposed insulating structure 110 and the drift region 103. For example, each of the gate insulating material layer 321M, the gate electrode material layer 320M and the capping pattern material layer 323M may be formed conformally. Subsequently, a second mask pattern M2 may be formed on the capping pattern material layer 323M.

Referring to FIG. 21, a capping pattern material layer (323M of FIG. 20), a gate electrode material layer (320M of FIG. 20) and a gate insulating material layer (321M of FIG. 20) may be etched, using the second mask pattern M2 as an etching mask. The gate insulating layer 321, the gate electrode 320 and the capping pattern 323 may be formed through such an etching process.

Referring to FIG. 18, after performing the fabricating processes shown in FIGS. 9 to 12, the etching stop layer 170 and the second interlayer insulating layer 180 may be sequentially formed on the first interlayer insulating layer 150, the source contact 161 and the drain contact 162. Subsequently, the first via 191 which penetrates the second interlayer insulating layer 180 and the etching stop layer 170 in the vertical direction DR3 and is connected to the source contact 161 may be formed. Further, the second via 192 which penetrates the second interlayer insulating layer 180 and the etching stop layer 170 in the vertical direction DR3 and is connected to the drain contact 162 may be formed. The semiconductor device shown in FIG. 18 may be fabricated through such a fabricating method.

Hereinafter, a semiconductor device according to an embodiment of the present disclosure will be described referring to FIG. 22. Differences from the semiconductor device shown in FIGS. 1 and 2 will be mainly described.

Figure 22:
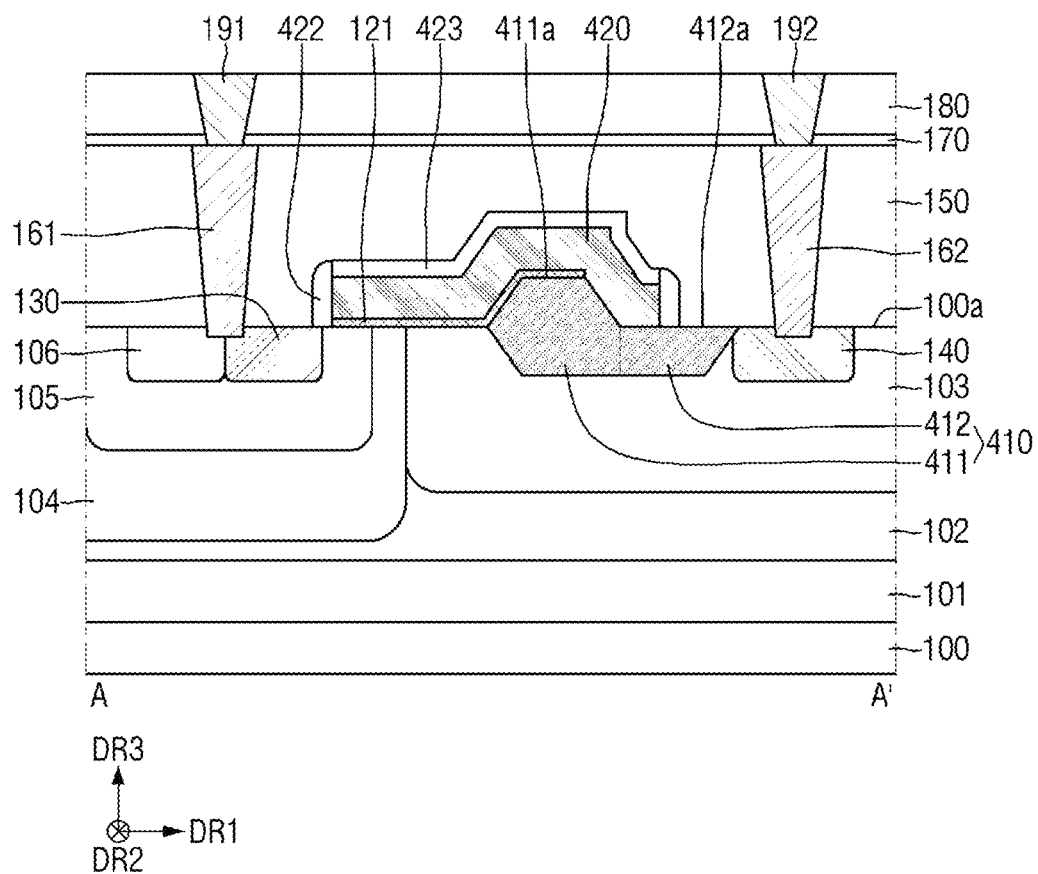
FIG. 22 is a cross-sectional view for explaining a semiconductor device according to an embodiment of the present disclosure.

FIG. 22 is a cross-sectional view for explaining a semiconductor device according to an embodiment of the present disclosure.

Referring to FIG. 22, in the semiconductor device according to an embodiment of the present disclosure, an uppermost surface 412a of a second portion 412 of an insulating structure 410 may be formed on the same plane as the upper surface 100a of the substrate 100.

A gate electrode 420 may have a step between an uppermost surface 411a of a first portion 411 of the insulating structure 410 and the uppermost surface 412a of the second portion 412 of the insulating structure 410. A gate spacer 422 disposed between the gate electrode 420 and the drain region 140 may be in contact with the uppermost surface 412a of the second portion 412 of the insulating structure 410. A capping pattern 423 may be disposed on the gate electrode 420.

Hereinafter, a semiconductor device according to an embodiment of the present disclosure will be described referring to FIG. 23. Differences from the semiconductor device shown in FIGS. 1 and 2 will be mainly described.

Figure 23:
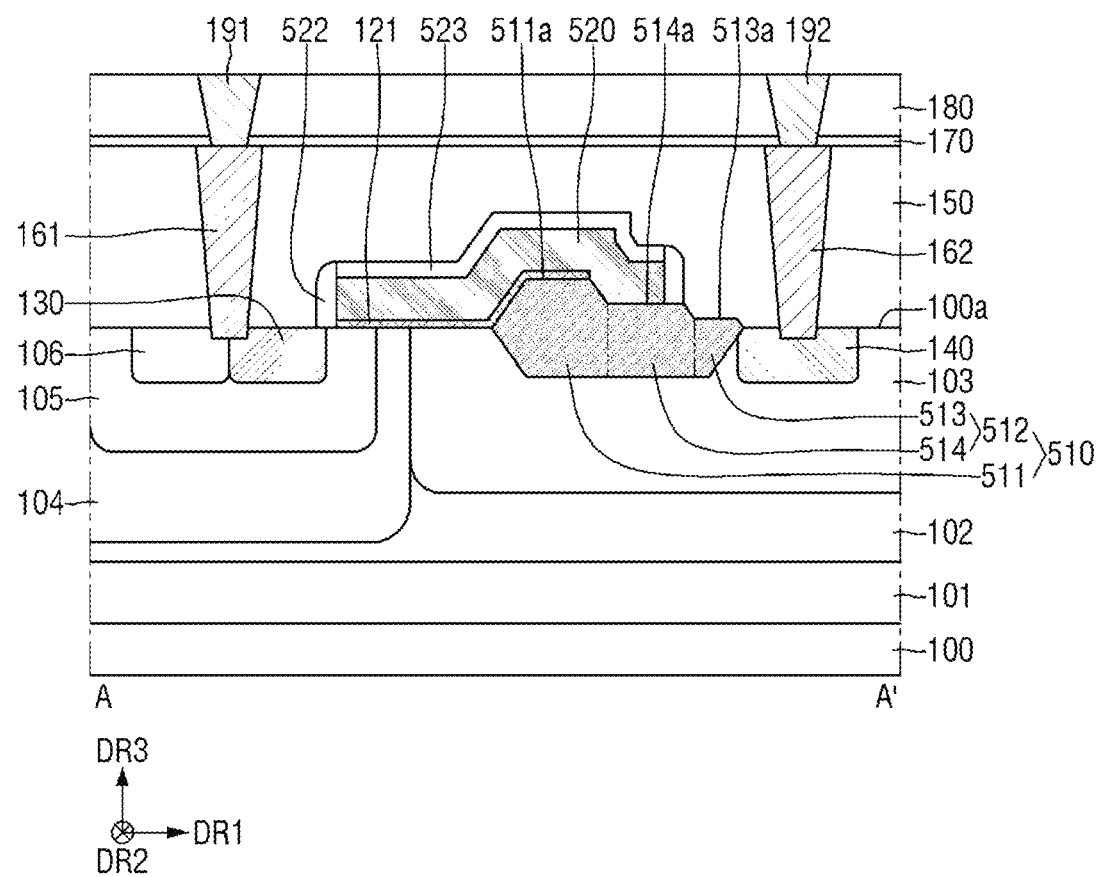
FIG. 23 is a cross-sectional view for explaining a semiconductor device according to an embodiment of the present disclosure.

FIG. 23 is a cross-sectional view for explaining a semiconductor device according to an embodiment of the present disclosure.

Referring to FIG. 23, in the semiconductor device according to an embodiment of the present disclosure, an upper surface of a second portion 512 of an insulating structure 510 may have a step.

The insulating structure 510 may include a first portion 511 adjacent to the source region 130, and a second portion 512 that is in contact with the drain region 140. The second portion 512 of the insulating structure 510 may include a third portion 513 that is in contact with the drain region 140, and a fourth portion 514 disposed between the first portion 511 of the insulating structure 510 and the third portion 513 of the insulating structure 510.

An uppermost surface 514a of the fourth portion 514 of the insulating structure 510 may be formed to be lower than an uppermost surface 511a of the first portion 511 of the insulating structure 510. An uppermost surface 513a of the third portion 513 of the insulating structure 510 may be formed to be lower than the uppermost surface 514a of the fourth portion 514 of the insulating structure 510.

The gate electrode 520 may be in contact with the uppermost surface 514a of the fourth portion 514 of the insulating structure 510. A gate spacer 522 disposed between the gate electrode 520 and the drain region 140 may be in contact with the uppermost surface 514a of the fourth portion 514 of the insulating structure 510. A capping pattern 523 may be disposed on the gate electrode 520.

Hereinafter, a semiconductor device according to an embodiment of the present disclosure will be described referring to FIG. 24. Differences from the semiconductor device shown in FIGS. 1 and 2 will be mainly described.

Figure 24:
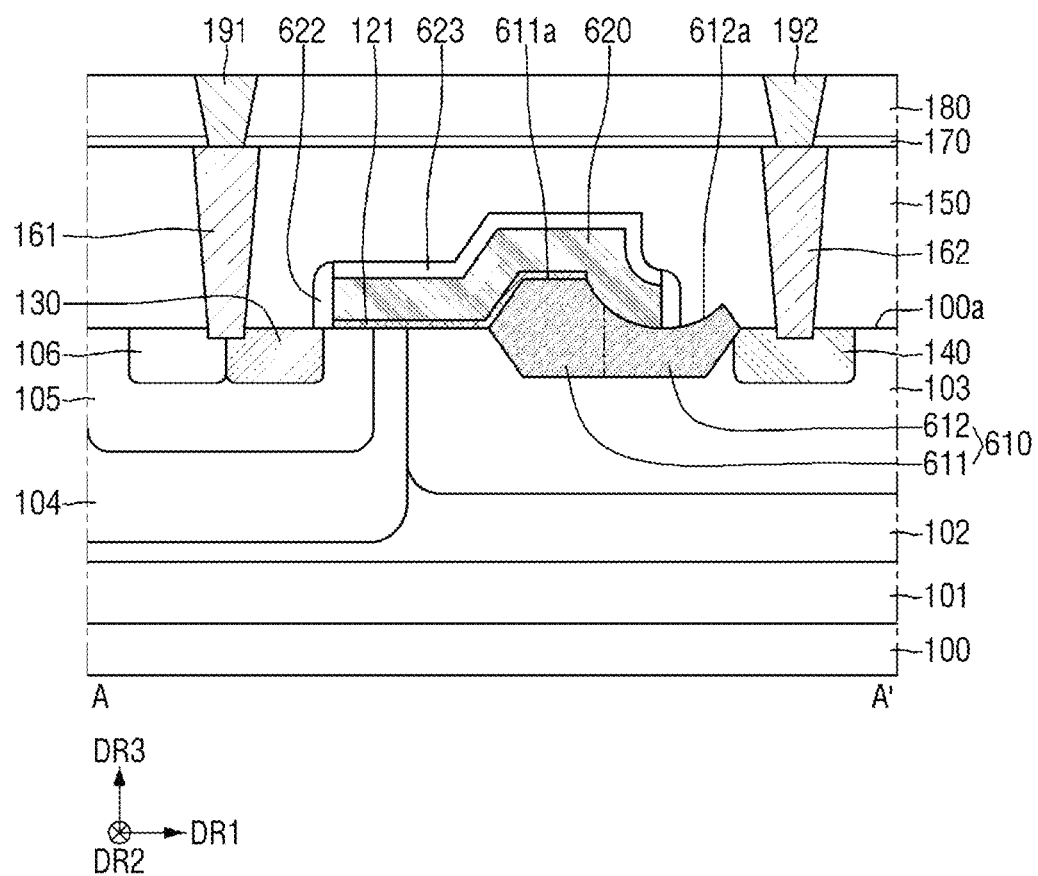
FIG. 24 is a cross-sectional view for explaining a semiconductor device according to an embodiment of the present disclosure.

FIG. 24 is a cross-sectional view for explaining a semiconductor device according to an embodiment of the present disclosure.

Referring to FIG. 24, in a semiconductor device according to an embodiment of the present disclosure, an upper surface 612a of a second portion 612 of an insulating structure 610 may be formed concavely toward the substrate 100. Further, a side wall of a first portion 611 of the insulating structure 610 adjacent to the second portion 612 of the insulating structure 610 may have a continuous slope profile with the upper surface 612a of the second portion 612 of the insulating structure 610. For example, the upper surface 612a may be a concave surface.

A top of the second portion 612 of the insulating structure 610 adjacent to the drain region 140 may be formed to be lower than an uppermost surface 611a of the first portion 611 of the insulating structure 610. The gate electrode 620 may be in contact with the upper surface 612a of the second portion 612 of the insulating structure 610. A gate spacer 622 disposed between the gate electrode 620 and the drain region 140 may be in contact with the upper surface 612a of the second portion 612 of the insulating structure 610. A capping pattern 623 may be disposed on the gate electrode 620.

Hereinafter, a semiconductor device according to an embodiment of the present disclosure will be described referring to FIG. 25. Differences from the semiconductor device shown in FIGS. 1 and 2 will be mainly described.

Figure 25:
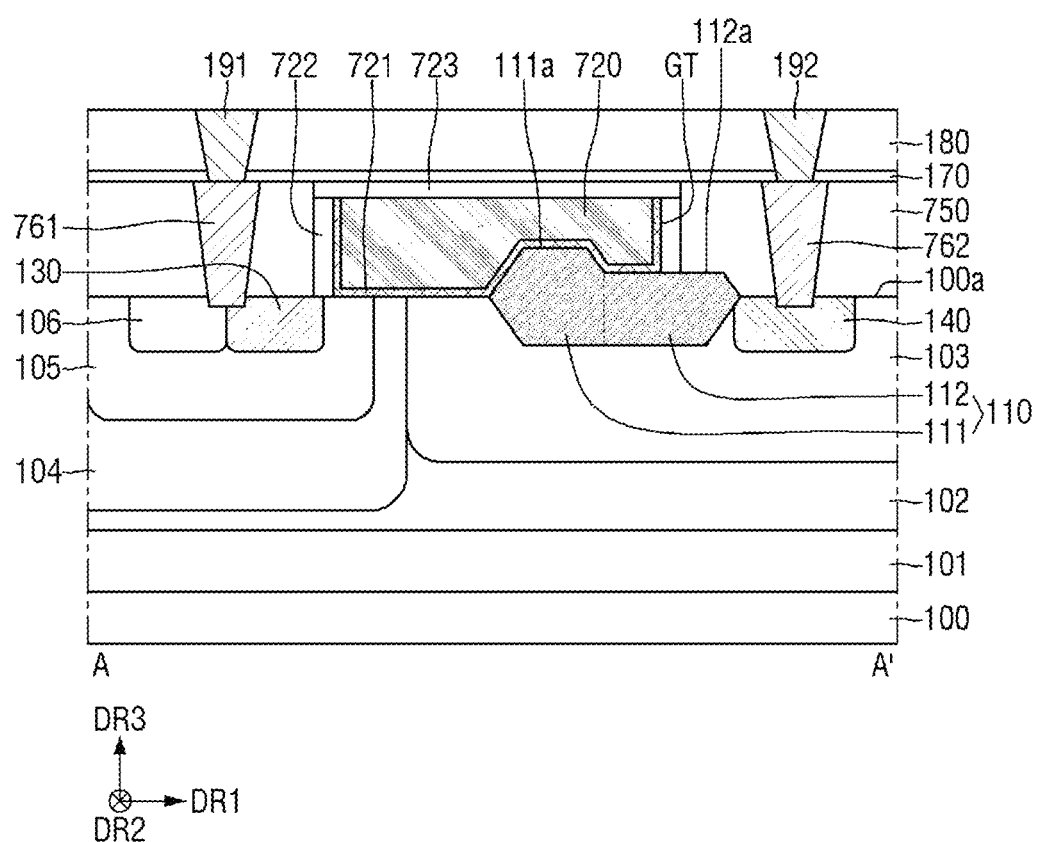
FIG. 25 is a cross-sectional view for explaining a semiconductor device according to an embodiment of the present disclosure.

FIG. 25 is a cross-sectional view for explaining a semiconductor device according to an embodiment of the present disclosure.

Referring to FIG. 25, in the semiconductor device according to an embodiment of the present disclosure, a gate insulating layer 721 may be disposed between the upper surface 100a of the substrate 100 and a gate electrode 720, between the insulating structure 110 and the gate electrode 720, and between a gate spacer 722 and the gate electrode 720.

A gate trench GT may be defined by the gate spacer 722 on the upper surface 100a of the substrate 100 and the insulating structure 110. The gate insulating layer 721 may be disposed along the bottom surface and side walls of the gate trench GT. The gate electrode 720 may fill the inside of the gate trench GT on the gate insulating layer 721.

The upper surface of the gate electrode 720 may be formed on the same plane as the upper surface of the gate spacer 722. For example, the upper surface of the gate electrode 720 disposed on the first portion 111 of the insulating structure 110, the upper surface of the gate electrode 720 disposed on the second portion 112 of the insulating structure 110, and the upper surface of the gate electrode 720 disposed on the well region 104 may each be formed on the same plane.

A capping pattern 723 may be formed on the upper surface of the gate spacer 722 and the upper surface of the gate electrode 720. For example, the upper surface of the first interlayer insulating layer 750 may be formed on the same plane as the upper surface of the capping pattern 723. However, the present disclosure is not limited thereto. In some other embodiments, a first interlayer insulating layer 750 may also be disposed on the upper surface of the capping pattern 723.

A source contact 761 may penetrate the first interlayer insulating layer 750 in the vertical direction DR3 and be connected to the source region 130 and the body contact region 106. A drain contact 762 may penetrate the first interlayer insulating layer 750 in the vertical direction DR3 and be connected to the drain region 140.

Hereinafter, a method for fabricating a semiconductor device according to an embodiment of the present disclosure will be described referring to FIGS. 25 to 30. Differences from the method for fabricating the semiconductor device shown in FIGS. 3 to 12 will be mainly described.

FIGS. 26 to 30 are intermediate stage diagrams for explaining a method for fabricating a semiconductor device according to an embodiment of the present disclosure.

Figure 26:
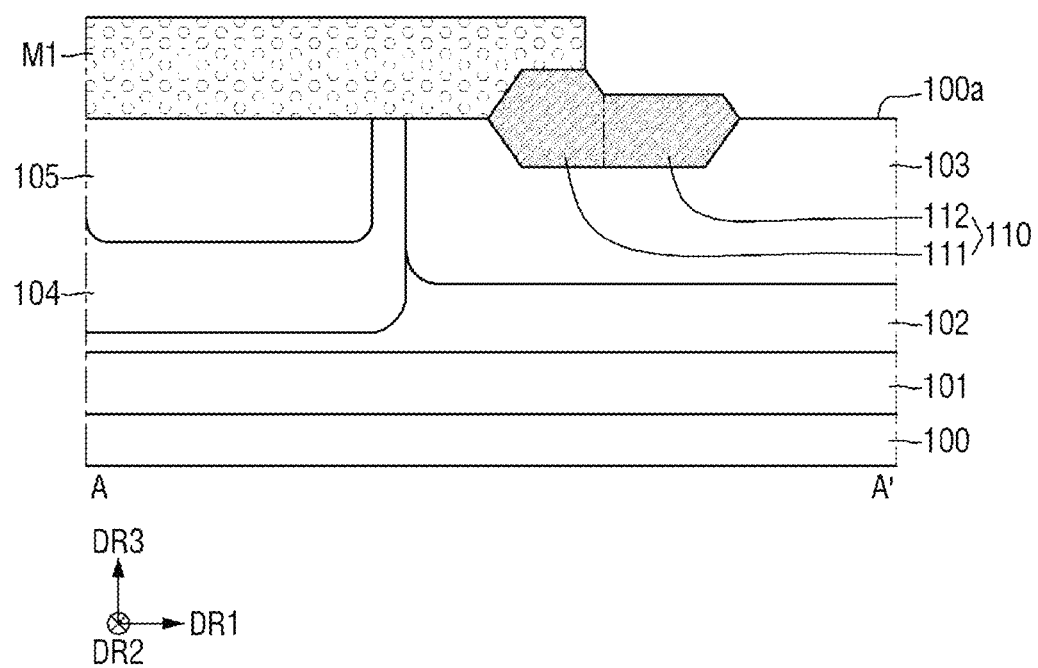
FIGS. 26 to 30 are intermediate stage diagrams for explaining a method for fabricating a semiconductor device according to an embodiment of the present disclosure.

Referring to FIG. 26, after performing the processes shown in FIGS. 3 to 5, the first mask pattern M1 may be formed on the well region 104, the body region 105, the drift region 103 adjacent to the pre-insulating structure (110p of FIG. 5), and a part of the pre-insulating structure (110p of FIG. 5).

Subsequently, a part of the exposed pre-insulating structure (110p of FIG. 5) may be etched, using the first mask pattern M1 as an etching mask. The insulating structure 110 having a stepped upper surface may be formed through such an etching process.

Figure 27:
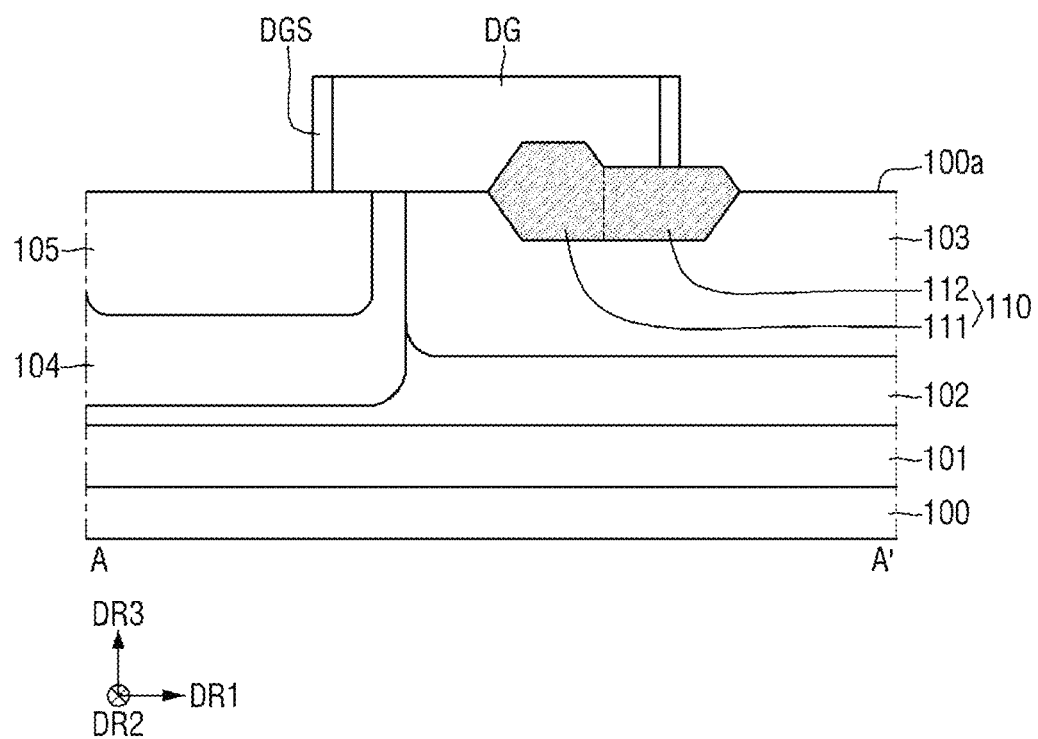

Referring to FIG. 27, after the first mask pattern M1 is removed, a dummy gate DG may be formed on the body region 105, the well region 104, the drift region 103 between the well region 104 and the insulating structure 110, the first portion 111 of the insulating structure 110, and a part of the second portion 112 of the insulating structure 110. Subsequently, a dummy gate spacer DGS may be formed on both side walls of the dummy gate DG in the first horizontal direction DR1. The dummy gate spacer DGS formed on the first side of the dummy gate DG in the first horizontal direction DR1 may be in contact with the body region 105. Further, the dummy gate spacer DGS formed on the second side of the dummy gate DG opposite to the first side of the dummy gate DG in the first horizontal direction DR1 may be in contact with the uppermost surface (112a of FIG. 25) of the second portion 112 of the insulating structure 110.

Figure 28:
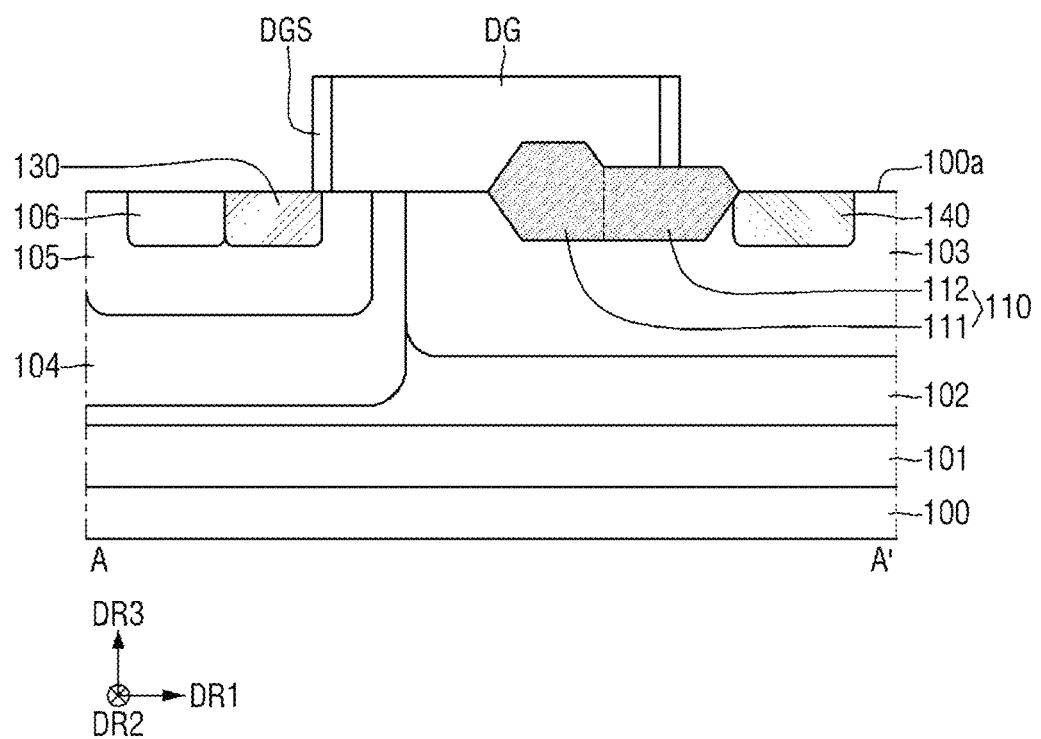

Referring to FIG. 28, a body contact region 106 and a source region 130 may be formed inside the body region 105 on the first side of the dummy gate DG. Further, a drain region 140 may be formed inside the drift region 103 on the second side of the dummy gate DG.

Figure 29:
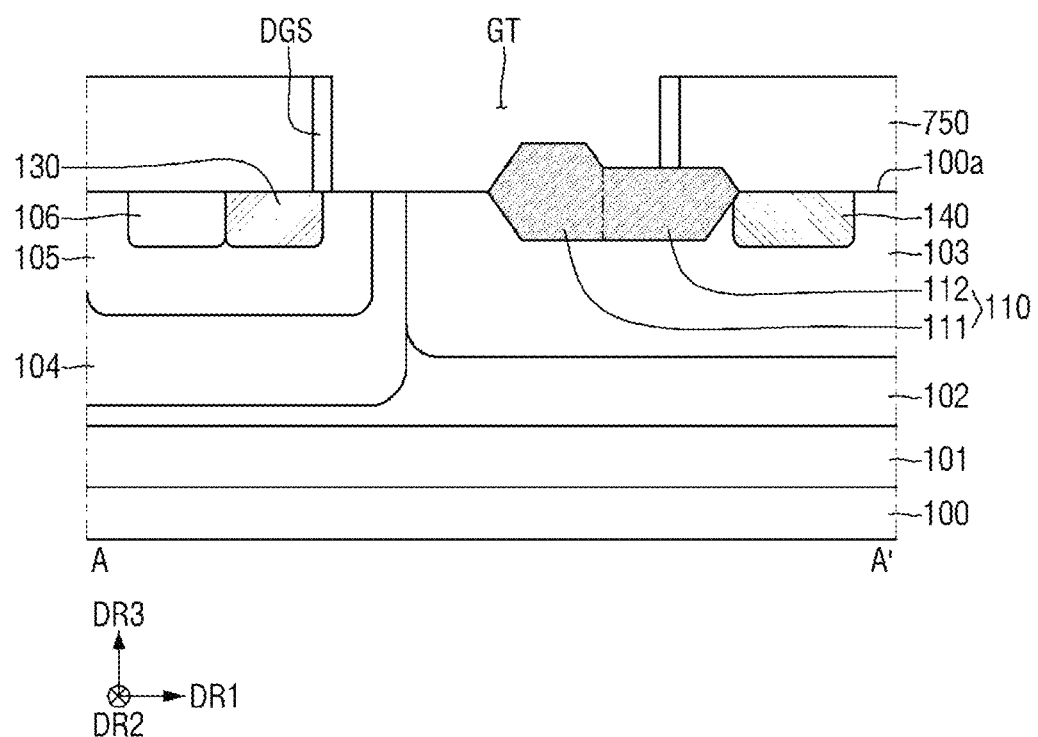

Referring to FIG. 29, a first interlayer insulating layer 750 may be formed to cover the side wall of the dummy gate spacer DGS on the upper surface 100a of the substrate 100 and the second portion 112 of the exposed insulating structure 110. Subsequently, the dummy gate DG may be removed. A portion from which the dummy gate DG is removed may be defined by the gate trench GT.

Figure 30:
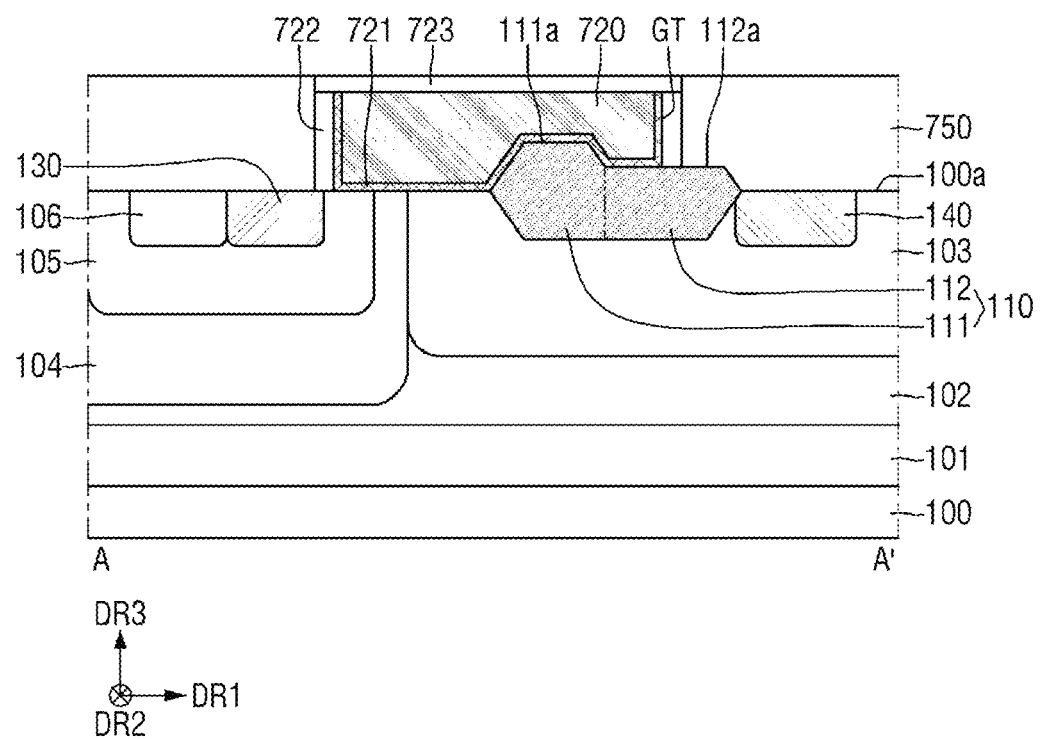

Referring to FIG. 30, the gate insulating layer 721 may be formed along the bottom surface and side walls of the gate trench GT. Further, the gate electrode 720 may be formed to fill the gate trench GT on the gate insulating layer 721. Subsequently, a part of the upper parts of each of the dummy gate spacer (DGS of FIG. 29), the gate insulating layer 721 and the gate electrode 720 may be etched.

Subsequently, a capping pattern 723 may be formed on the etched portions of each of the dummy gate spacer (DGS of FIG. 29), the gate insulating layer 721, and the gate electrode 720. The upper surface of the capping pattern 723 may be formed on the same plane as the upper surface of the first interlayer insulating layer 750.

Referring to FIG. 25, a source contact 761 which penetrates the first interlayer insulating layer 750 in the vertical direction DR3 and is connected to the source region 130 and the body contact region 106 may be formed. Further, a drain contact 762 which penetrates the first interlayer insulating layer 750 in the vertical direction DR3 and is connected to the drain region 140 may be formed.

Subsequently, an etching stop layer 170 and a second interlayer insulating layer 180 may be sequentially formed on the first interlayer insulating layer 750, the capping pattern 723, the source contact 761 and the drain contact 762. Subsequently, a first via 191 which penetrates the second interlayer insulating layer 180 and the etching stop layer 170 in the vertical direction DR3 and is connected to the source contact 761 may be formed. Further, a second via 192 which penetrates the second interlayer insulating layer 180 and the etching stop layer 170 in the vertical direction DR3 and is connected to the drain contact 762 may be formed. The semiconductor device shown in FIG. 25 may be fabricated through such a fabricating method.

In an embodiment, the semiconductor device described above may be used to implement a MOSFET transistor or a power MOSFET. At least one embodiment of the MOSFET transistor may have an increased breakdown voltage relative to a conventional MOSFET transistor. At least one embodiment of the MOSFET transistor may have fewer instances of a Hot Carrier Injection phenomenon as compared to a conventional MOSFET transistor.

In concluding the detailed description, those skilled in the art will appreciate that many variations and modifications may be made to these embodiments without substantially departing from the principles of the present disclosure. Therefore, the disclosed embodiments of the disclosure are used in a generic and descriptive sense only and not for purposes of limitation.

What is claimed is:

1. A semiconductor device comprising:
   a substrate;
   a gate electrode disposed on an upper surface of the substrate;
   a source region disposed on a first side of the gate electrode;
   a drain region disposed on a second side of the gate electrode opposite to the first side of the gate electrode in a horizontal direction;
   an insulating structure at least partially buried inside the substrate, wherein the insulating structure comprises a first portion disposed between the substrate and the gate electrode, and a second portion in contact with the drain region;
   a gate insulating layer disposed between the upper surface of the substrate and the gate electrode; and
   a gate spacer disposed on each of the first side and the second side of the gate electrode,
   wherein an uppermost surface of the second portion of the insulating structure is lower than an uppermost surface of the first portion of the insulating structure,
   wherein at least a part of the gate electrode is disposed on the uppermost surface of the second portion of the insulating structure, and
   wherein the gate spacer disposed on the second side of the gate electrode is in contact with the uppermost surface of the second portion of the insulating structure.

2. The semiconductor device of claim 1, wherein the uppermost surface of the first portion of the insulating structure is higher than the upper surface of the substrate.

3. The semiconductor device of claim 1,
   wherein the gate insulating layer is disposed between the uppermost surface of the insulating structure and the gate electrode.

4. The semiconductor device of claim 3, wherein the gate insulating layer is disposed between the uppermost surface of the second portion of the insulating structure and the gate electrode.

5. The semiconductor device of claim 1,
   wherein the gate insulating layer is not disposed between the uppermost surface of the insulating structure and the gate electrode.

6. The semiconductor device of claim 1, wherein the uppermost surface of the second portion of the insulating structure is located on a same plane as the upper surface of the substrate.

7. The semiconductor device of claim 1, wherein the second portion of the insulating structure comprises: a third portion in contact with the drain region, and a fourth portion disposed between the first portion of the insulating structure and the third portion of the insulating structure, an uppermost surface of the fourth portion of the insulating structure is lower than the uppermost surface of the first portion of the insulating structure, and an uppermost surface of the third portion of the insulating structure is lower than the uppermost surface of the fourth portion of the insulating structure.

8. The semiconductor device of claim 1, wherein the upper surface of the second portion of the insulating structure is concave.

9. The semiconductor device of claim 1,
   wherein the gate insulating layer is disposed between the gate spacer and the gate electrode.

10. The semiconductor device of claim 9, wherein an upper surface of the gate electrode disposed on the first portion of the insulating structure is located on a same plane as the upper surface of the gate electrode disposed on the second portion of the insulating structure.

11. A semiconductor device comprising:
a substrate;
a gate electrode disposed on an upper surface of the substrate;
a source region disposed on a first side of the gate electrode;
a drain region disposed on a second side of the gate electrode opposite to the first side of the gate electrode in a horizontal direction;
an insulating structure disposed on the substrate, wherein the insulating structure includes a first portion disposed between the substrate and the gate electrode, and a second portion in contact with the drain region;
a gate insulating layer disposed between the upper surface of the substrate and the gate electrode, and between an uppermost surface of the first portion of the insulating structure and the gate electrode; and
a gate spacer disposed on each of the first side and the second side of the gate electrode,
wherein an uppermost surface of the second portion of the insulating structure is lower than the uppermost surface of the first portion of the insulating structure, and the gate spacer disposed on the second side of the gate electrode is in contact with the uppermost surface of the second portion of the insulating structure.

12. The semiconductor device of claim 11, wherein at least a part of the gate electrode is disposed on the uppermost surface of the second portion of the insulating structure.

13. The semiconductor device of claim 11, wherein at least a part of the insulating structure is buried inside the substrate, and the uppermost surface of the first portion of the insulating structure is higher than the upper surface of the substrate.

14. The semiconductor device of claim 11, further comprising: a capping pattern disposed on the upper surface of the gate electrode and has a step shape on the insulating structure.

15. The semiconductor device of claim 11, wherein the gate insulating layer is disposed between the uppermost surface of the second portion of the insulating structure and the gate electrode.

16. The semiconductor device of claim 11, wherein the second portion of the insulating structure comprises:
a third portion in contact with the drain region; and
a fourth portion disposed between the first portion of the insulating structure and the third portion of the insulating structure, an uppermost surface of the fourth portion of the insulating structure is lower than the uppermost surface of the first portion of the insulating structure, and an uppermost surface of the third portion of the insulating structure is lower than the uppermost surface of the fourth portion of the insulating structure.

17. The semiconductor device of claim 16, wherein the gate spacer disposed on the second side of the gate electrode is in contact with the uppermost surface of the fourth portion of the insulating structure.

18. The semiconductor device of claim 11, wherein the gate insulating layer is disposed between the gate spacer and the gate electrode.

19. A semiconductor device comprising:
a substrate;
a gate electrode disposed on an upper surface of the substrate;
a source region disposed on a first side of the gate electrode;
a drain region disposed on a second side of the gate electrode opposite to the first side of the gate electrode in a horizontal direction;
an insulating structure at least partially buried inside the substrate, wherein an uppermost surface of the insulating structure is higher than the upper surface of the substrate, and the insulating structure includes a first portion disposed between the substrate and the gate electrode, and a second portion in contact with the drain region;
a gate insulating layer disposed between the upper surface of the substrate and the gate electrode and between an uppermost surface of the first portion of the insulating structure and the gate electrode, and is not disposed between an uppermost surface of the second portion of the insulating structure and the gate electrode;
a gate spacer disposed on each of the first side and the second side of the gate electrode; and
a capping pattern disposed on an uppermost surface of the gate electrode and having a step shape on the insulating structure,
wherein the uppermost surface of the second portion of the insulating structure is lower than the uppermost surface of the first portion of the insulating structure, at least a part of the gate electrode is disposed on the uppermost surface of the second portion of the insulating structure, and the gate spacer disposed on the second side of the gate electrode is in contact with the uppermost surface of the second portion of the insulating structure.

* * * * *